US012805152B2

(12) United States Patent
Ueta et al.

(10) Patent No.: US 12,805,152 B2
(45) Date of Patent: Nov. 17, 2026

(54) LIGHT-EMITTING ELEMENT, DISPLAY DEVICE, AND METHOD OF MANUFACTURING LIGHT-EMITTING ELEMENT

(71) Applicant: Sharp Display Technology Corporation, Kameyama City (JP)

(72) Inventors: Yoshihiro Ueta, Kameyama City (JP); Takayuki Naka, Kameyama City (JP)

(73) Assignee: Sharp Display Technology Corporation, Kameyama City (JP)

(*) Notice: Subject to any disclaimer, the term of this patent is extended or adjusted under 35 U.S.C. 154(b) by 368 days.

(21) Appl. No.: 18/293,674

(22) PCT Filed: Oct. 1, 2021

(86) PCT No.: PCT/JP2021/036445
§ 371 (c)(1),
(2) Date: Jan. 30, 2024

(87) PCT Pub. No.: WO2023/053451
PCT Pub. Date: Apr. 6, 2023

(65) Prior Publication Data
US 2024/0349574 A1 Oct. 17, 2024

(51) Int. Cl.

| | |
|---|---|
| ***H10K 59/80*** | (2023.01) |
| ***H10K 59/12*** | (2023.01) |
| ***H10K 59/122*** | (2023.01) |
| ***H10K 102/00*** | (2023.01) |

(52) U.S. Cl.
CPC ......... *H10K 59/80* (2023.02); *H10K 59/1201* (2023.02); *H10K 59/122* (2023.02); *H10K 2102/351* (2023.02)

(58) Field of Classification Search
CPC .. H10K 59/80; H10K 59/1201; H10K 59/122; H10K 2102/351; H10K 50/15; H10K 50/17; H05B 33/10; H05B 33/12; H05B 33/14; H05B 33/22
See application file for complete search history.

(56) References Cited

U.S. PATENT DOCUMENTS

| | | | | |
|---|---|---|---|---|
| 10,522,787 | B1 * | 12/2019 | Montgomery | H10K 50/11 |
| 12,224,381 | B2 * | 2/2025 | Kimoto | H10F 77/1433 |
| 2010/0193817 | A1 | 8/2010 | Amamiya et al. | |
| 2013/0126842 | A1 | 5/2013 | Takeuchi et al. | |
| 2013/0140589 | A1 | 6/2013 | Kwak | |
| 2021/0098732 | A1 | 4/2021 | Katagiri et al. | |
| 2021/0193876 | A1 * | 6/2021 | Chen | H10K 71/621 |
| 2022/0115446 | A1 * | 4/2022 | Kamada | H10K 59/351 |
| 2022/0285646 | A1 * | 9/2022 | Kimoto | H10K 50/16 |
| 2022/0325179 | A1 * | 10/2022 | Jang | H10K 50/15 |

(Continued)

FOREIGN PATENT DOCUMENTS

| | | |
|---|---|---|
| JP | 2007-188779 A | 7/2007 |
| JP | 2012-134171 A | 7/2012 |
| JP | 2013-118182 A | 6/2013 |

(Continued)

*Primary Examiner* — J. E. Schoenholtz
(74) *Attorney, Agent, or Firm* — ScienBiziP, P.C.

(57) ABSTRACT

An electron transport layer provided between a cathode and a light-emitting layer has pores above a vicinity region of a boundary line between a top face of an anode and a side face of a bank, the vicinity region including the boundary line.

15 Claims, 17 Drawing Sheets

(56) References Cited

U.S. PATENT DOCUMENTS

2022/0328730 A1 * 10/2022 Kimoto ................ H10H 20/831

FOREIGN PATENT DOCUMENTS

| | | | |
|---|---|---|---|
| JP | 2013-207206 | A | 10/2013 |
| JP | 2021-057296 | A | 4/2021 |
| JP | 2021-064543 | A | 4/2021 |
| WO | 2012/017492 | A | 2/2012 |

* cited by examiner

LIGHT-EMITTING ELEMENT, DISPLAY DEVICE, AND METHOD OF MANUFACTURING LIGHT-EMITTING ELEMENT

TECHNICAL FIELD

The disclosure relates to light-emitting elements, display devices, and methods of manufacturing a light-emitting element.

BACKGROUND ART

Improvement in the luminous efficiency of electroluminescent elements is required. An electroluminescent element is, for example, a QLED (quantum-dot light-emitting diode) or an OLED (organic light-emitting diode).

Patent Document 1 discloses a structure including a conductive material layer between pixel electrodes such as to guide leakage current from the pixel electrodes to flow into the conductive material layer.

Patent Documents 2 and 3 disclose a structure including, between a pixel electrode and a light-emitting layer, a hole injection layer and a hole transport layer each of which is divided for each pixel.

CITATION LIST

Patent Document

Patent Document 1: Japanese Unexamined Patent Application Publication No. 2013-118182 (Publication Date: Jun. 13, 2013)

Patent Document 2: Japanese Unexamined Patent Application Publication No. 2021-57296 (Publication Date: Apr. 8, 2021)

Patent Document 3: Re-published Japanese Translation of PCT Application No. WO2012/017492 (Publication Date: Feb. 9, 2012)

SUMMARY

Technical Problem

The structure disclosed in Patent Document 1 does not reduce leakage current.

In the structure disclosed in Patent Documents 2 and 3, the hole injection layer and the hole transport layer are patterned. The etching step, rinsing step, and resist layer for the patterning degrade the performance of the hole transport material.

For these reasons, the electroluminescent element structured as disclosed in Patent Documents 1 to 3 has a low luminous efficiency, which is an issue.

Solution to Problem

A light-emitting element in one aspect of the present disclosure includes: a first electrode and a second electrode opposite each other; a bank at least partially adjacent to the first electrode or at least partially on the first electrode; a light-emitting layer between the first electrode and the second electrode; and a functional layer either between the first electrode and the light-emitting layer or between the second electrode and the light-emitting layer, wherein a vicinity region of the boundary line includes a boundary line between a top face of the first electrode and a side face of the bank and a vicinity of the boundary line, and the functional layer has a pore above the vicinity region of the boundary line.

A light-emitting element in one aspect of the present disclosure may be configured such that the vicinity region includes a region parallel to the top face of the first electrode, the region spreading up to 200 nm from the boundary line on both sides of the boundary line.

A light-emitting element in one aspect of the present disclosure may be configured such that the vicinity region of the functional layer has a porosity of from 9% to 60%, both inclusive.

A light-emitting element in one aspect of the present disclosure may be configured such that either one or both of an angle between line segment AC and line segment AD and an angle between line segment EB and line segment FB is (are) less than or equal to 90°, where point A and point B are two points on a profile line of the pore that are separated by a maximum linear distance, and W is a linear distance between point A and point B, linear line L3 is a straight line that is perpendicular to line segment AB and that passes through a location on line segment AB distanced by W/10 from point A, linear line L4 is a straight line that is perpendicular to line segment AB and that passes through a location on line segment AB distanced by W/10 from point B, point C and point D are intersections of the profile line of the pore 40 and linear line L3, and point E and point F are intersections of the profile line of the pore 40 and linear line L4.

A light-emitting element in one aspect of the present disclosure may be configured such that either one or both of an angle between line segment AC and line segment AD and an angle between line segment EB and line segment FB exceeds 90°, where point A and point B are two points on a profile line of the pore that are separated by a maximum linear distance, and W is a linear distance between point A and point B, linear line L3 is a straight line that is perpendicular to line segment AB and that passes through a location on line segment AB distanced by W/10 from point A, linear line L4 is a straight line that is perpendicular to line segment AB and that passes through a location on line segment AB distanced by W/10 from point B, point C and point D are intersections of the profile line of the pore 40 and linear line L3, and point E and point F are intersections of the profile line of the pore 40 and linear line L4.

A light-emitting element in one aspect of the present disclosure may be configured such that $D1<D2$, where D1 is a thickness of the functional layer above a center of the first electrode, the thickness being taken perpendicular to the top face of the first electrode, and D2 is a thickness of the functional layer above the boundary line, the thickness being taken perpendicular to the top face of the first electrode.

A light-emitting element in one aspect of the present disclosure may be configured such that the functional layer contains a metal oxide.

A light-emitting element in one aspect of the present disclosure may be configured such that the metal oxide contains a metal element selected from the group consisting of Zn, Cr, Ni, Ti, Nb, Al, Si, Mg, Li, W, Mo, In, Ga, Ta, Hf, Zr, Y, La, Sr, and Mo.

A light-emitting element in one aspect of the present disclosure may be configured such that the metal oxide contains at least one metal element.

A light-emitting element in one aspect of the present disclosure may be configured such that the functional layer contains an organic compound.

A light-emitting element in one aspect of the present disclosure may be configured such that the organic compound contains an organic hole transport material selected from the group consisting of PVK, TFB, p-TPD, PPV, and $Alq_3$.

A light-emitting element in one aspect of the present disclosure may be configured such that the functional layer is a charge injection layer.

A light-emitting element in one aspect of the present disclosure may be configured such that the functional layer is a charge transport layer.

A display device in one aspect of the present disclosure includes a plurality of the light-emitting elements, wherein the functional layer is formed commonly to the plurality of the light-emitting elements.

A display device in one aspect of the present disclosure includes a plurality of the light-emitting elements, wherein the functional layer is formed commonly to the plurality of the light-emitting elements and is a first charge transport layer, the display device further including a second charge transport layer having an opposite polarity to the first charge transport layer, wherein the light-emitting layer is sandwiched between the first charge transport layer and the second charge transport layer, and the second charge transport layer is at least partially in direct contact with the first charge transport layer above the bank.

A display device in one aspect of the present disclosure includes a plurality of the light-emitting elements, the display device further including: a first charge transport layer; and a second charge transport layer having an opposite polarity to the first charge transport layer, wherein the light-emitting layer is sandwiched between the first charge transport layer and the second charge transport layer, and the second charge transport layer is at least partially in direct contact with the first charge transport layer above the bank.

A method of manufacturing a light-emitting element in one aspect of the present disclosure includes: a step of forming a first electrode; a step of forming a bank at least partially adjacent to the first electrode or at least partially on the first electrode; a step of forming a light-emitting layer on the first electrode; and a step of forming a second electrode on the light-emitting layer, the method further including a step of forming a functional layer either between the first electrode and the light-emitting layer or between the second electrode and the light-emitting layer, wherein the step of forming the functional layer includes: a step of obtaining a coating film by applying a component solution containing a medium and a material for the functional layer onto the first electrode or the light-emitting layer; and a step of rapidly elevating temperature of the coating film.

A method of manufacturing a light-emitting element in one aspect of the present disclosure may be configured such that the step of forming the functional layer further includes, after the step of rapidly elevating the temperature of the coating film, a step of thermally insulating the coating film.

A method of manufacturing a light-emitting element in one aspect of the present disclosure may be configured such that in the step of rapidly elevating the temperature of the coating film, a rate of temperature increase is greater than or equal to 1 degree Celsius/second.

A method of manufacturing a light-emitting element in one aspect of the present disclosure may be configured such that in the step of rapidly elevating the temperature of the coating film, a target temperature is lower than or equal to a heat-resistant temperature of the layers formed before the step of forming the functional layer.

A method of manufacturing a light-emitting element in one aspect of the present disclosure may be configured such that the step of rapidly elevating the temperature of the coating film is performed before the step of forming the light-emitting layer.

A method of manufacturing a light-emitting element in one aspect of the present disclosure may be configured such that in the step of obtaining the coating film, the component solution comes into direct contact with an underlayer layer at a contact angle of less than 90°.

Advantageous Effects of Disclosure

The present disclosure, in an aspect thereof, enables improving the luminous efficiency of the light-emitting element.

DESCRIPTION OF EMBODIMENTS

Embodiment 1

Overview of Display Device

Figure 1:
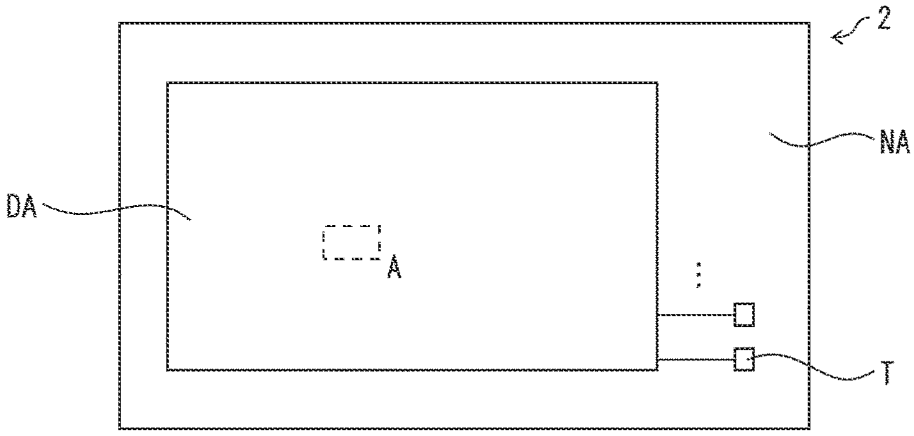
FIG. 1 is a schematic plan view of an exemplary structure of a display device in accordance with an embodiment of the present disclosure.

FIG. 1 is a schematic plan view of an exemplary structure of a display device 2 in accordance with an embodiment of the present disclosure.

Referring to FIG. 1, the display device 2 in accordance with the present disclosure includes: a display area DA in which a display is produced by extracting the light emitted by light-emitting elements detailed later; and a frame area NA surrounding the display area DA. The frame area NA has formed therein terminals T through which signals are fed for driving the light-emitting elements in the display device 2.

Figure 2:
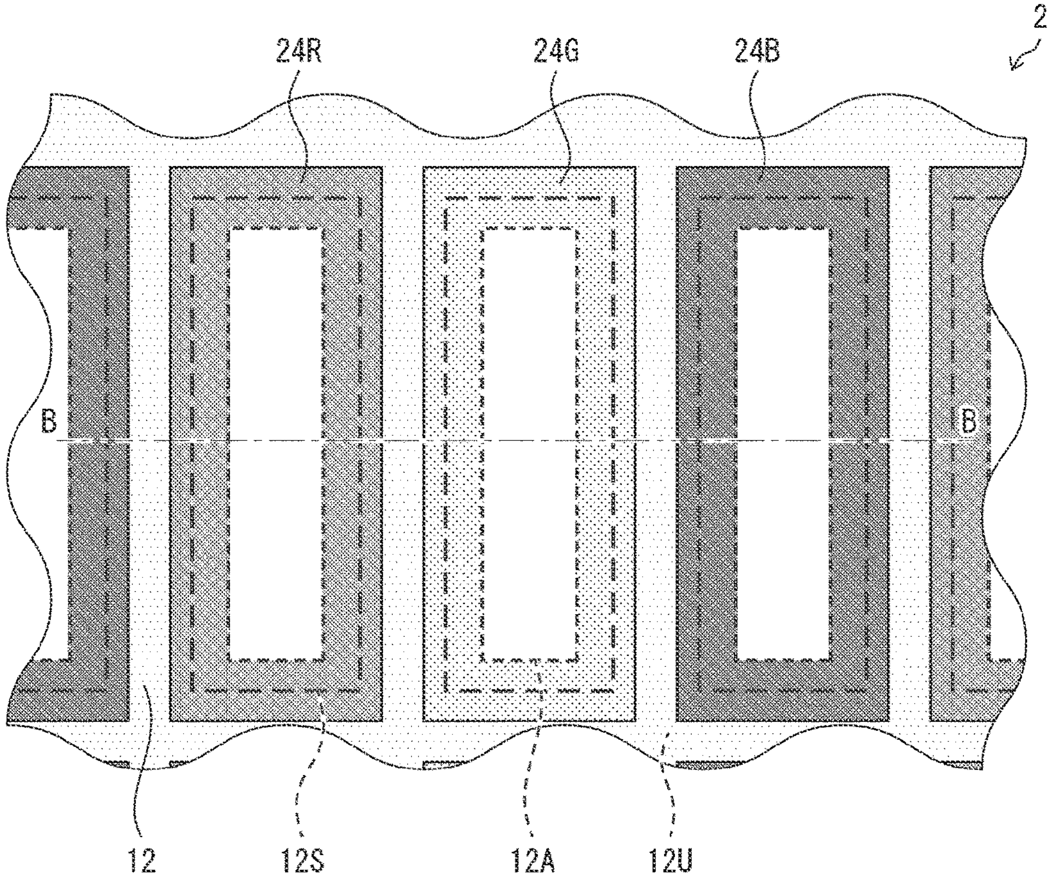
FIG. 2 is a schematic plan view of an exemplary structure of a display area shown in FIG. 1.

FIG. 2 is a schematic plan view of an exemplary structure of the display area DA shown in FIG. 1. FIG. 2 is an equivalent of an enlarged plan view of region A in FIG. 1. Note that in FIG. 2, to show the relative positions of a bank 12 and a light-emitting layer 24, both of which will be detailed later, the other structural elements are omitted.

Figure 3:
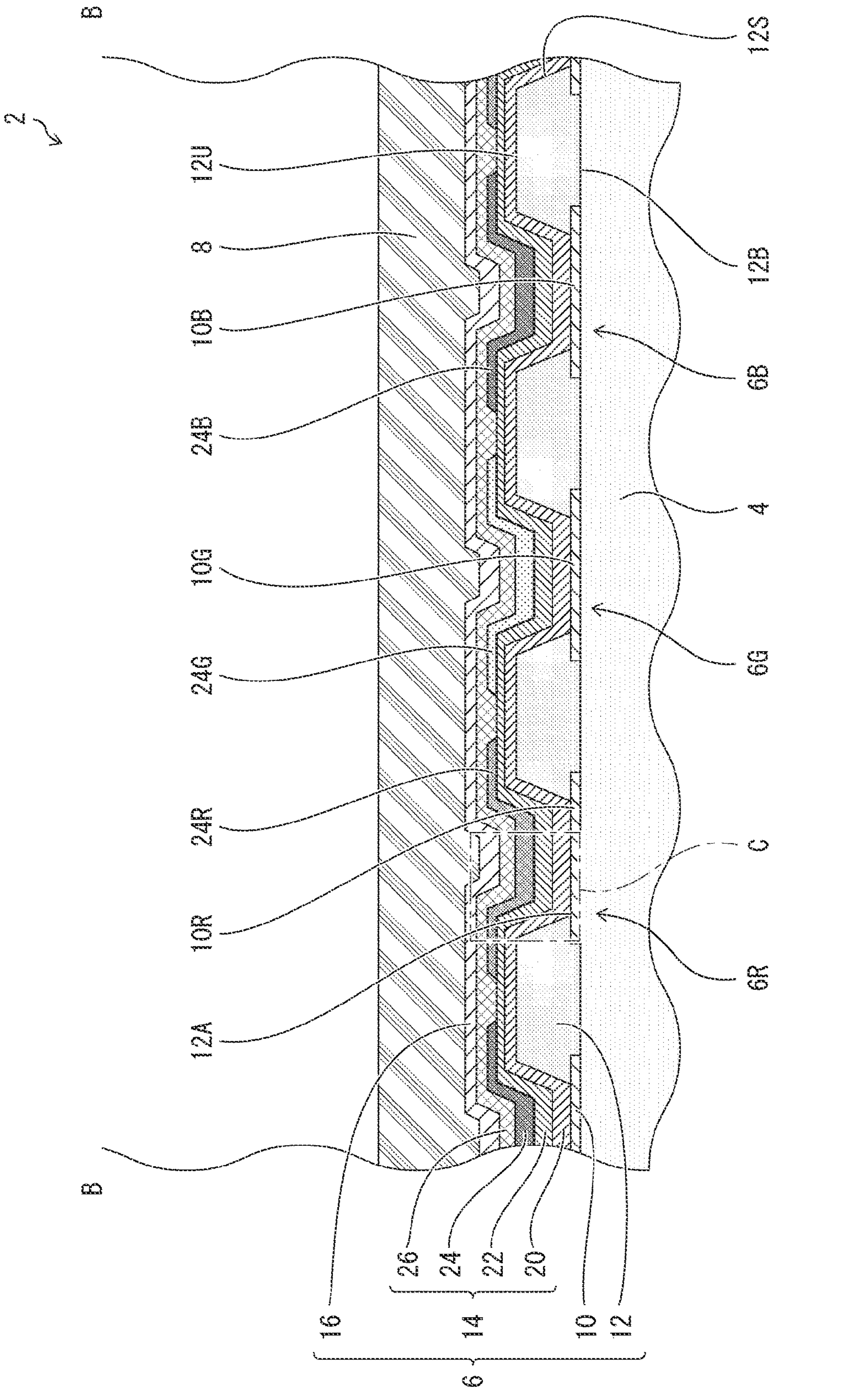
FIG. 3 is a schematic cross-sectional view of an exemplary structure of the display area shown in FIG. 1.

FIG. 3 is a schematic cross-sectional view, taken along line B-B shown in FIG. 2, of an exemplary structure of the display area DA shown in FIG. 1.

The display device 2 in accordance with the present embodiment includes a plurality of electroluminescent elements in the display area DA. FIGS. 2 and 3 show a red light-emitting element 6R, a green light-emitting element 6G, and a blue light-emitting element 6B of all the plurality of electroluminescent elements in the display device 2. In the present disclosure, the "light-emitting element" refers to one of the red light-emitting element 6R, the green light-emitting element 6G, and the blue light-emitting element 6B unless otherwise mentioned explicitly.

Referring to FIG. 3, the display device 2 includes: a substrate 4; a light-emitting element layer 6 on the substrate 4; and a sealing layer 8 covering the light-emitting element layer 6.

Substrate

The substrate 4 includes a support substrate. The substrate 4 includes a thin film transistor layer (TFT layer) including thin film transistors (TFT's) and other circuit elements on the support substrate. The substrate 4 may further include a barrier layer and other additional structural elements. The barrier layer alleviates penetration of, for example, moisture and oxygen into the light-emitting element layer 6 from outside the support substrate.

The support substrate may be either a non-flexible substrate made of, for example, quartz or glass or a flexible substrate made of a resin film or a resin sheet. A quartz substrate and a glass substrate are preferred because of their high light-transmitting properties and high gas-blocking properties. In addition, in view of light-transmitting properties and gas-blocking properties, when the support substrate includes a resin film, the material is preferably, for example, a methacrylic resin, which is typical polyethylene methacrylate (PMMA), a polyester resin, which is typically polyethylene terephthalate (PET), polyethylene naphthalate (PEN), or polybutylene naphthalate (PBN), and a polycarbonate resin.

Light-Emitting Element Layer

The light-emitting element layer 6 includes light-emitting elements formed therein.

The light-emitting element layer 6 includes an anode 10 (first electrode), the bank 12, an active layer 14, and a cathode 16 (second electrode), which are provided in this order when viewed from the substrate 4. The active layer 14 includes a hole injection layer 20 (functional layer, charge injection layer), a hole transport layer 22 (functional layer, charge transport layer, first charge transport layer, second charge transport layer), the light-emitting layer 24, and an electron transport layer 26 (functional layer, charge transport layer, first charge transport layer, second charge transport layer), which are provided in this order when viewed from the anode 10. The active layer 14 may be alternatively referred to as the electroluminescence layer (EL layer).

Throughout the present disclosure, the direction from the light-emitting layer 24 toward the anode 10 in the light-emitting element layer 6 is referred to as "downward," and the direction from the light-emitting layer 24 toward the cathode 16 is referred to as "upward."

In the current context, the anode 10 is provided individually for each light-emitting element. The anode 10 is provided individually for each light-emitting element, that is, insularly for each subpixel and is alternatively referred to as the pixel electrode. The anode 10 includes an anode 10R for the red light-emitting element 6R, an anode 10G for the green light-emitting element 6G, and an anode 10B for the blue light-emitting element 6B. On the other hand, the hole injection layer 20, the hole transport layer 22, the electron transport layer 26, and the cathode 16 are each provided commonly to a plurality of light-emitting elements. The cathode 16 is alternatively referred to as the common electrode.

The bank 12 may be provided individually for each light-emitting element, but preferably provided integral to a plurality of light-emitting elements as shown in FIG. 2 to achieve high definition of the display device 2. The bank 12 has an opening 12A in which the top face of the anode 10 is exposed. It should be understood however that the term, "exposed," merely describes a shape in the relationship of the two layers (the bank 12 and the anode 10), and another layer is eventually formed in the exposed portion as described in the following. Throughout the following, the term, "exposed," describes a shape in the relationship of the two layers (the bank 12 and the anode 10). The bank 12 has a bottom face 12B facing the substrate 4, a top face 12U facing the sealing layer 8, and a side face 12S between the bottom face 12B and the top face 12U. Note that the part indicated by a broken line as the side face 12S in FIG. 2 is a boundary portion between the side face 12S and the top face 12U of the bank 12. The side face 12S includes an inclined side face and is alternatively referred to as the "inclined face." It should be understood however that both the side face and the inclined face are not necessarily a plane and may include, for example, a plurality of planes, a curved face, or a non-flat surface.

The bank 12 is provided either at least partially adjacent to the anode 10 or at least partially on the anode 10 in a top view. In the present disclosure, the term, "adjacent," is used to not only depict an object sitting next to, and also in contact with, another object, but also depict the object sitting next to, and distanced from, the other object.

The bank 12 is a protrusion formed along a peripheral portion of the light-emitting element and is not limited in function. The bank 12 may be provided on a part of the peripheral portion of the light-emitting element. The bank 12 may, either alone or in cooperation with other structural elements, perform an arbitrary function other than the function of providing a non-flat surface.

For instance, the bank 12 is preferably formed as a partition wall between adjacent light-emitting elements to provide electrical insulation between the light-emitting elements. In this structure, the bank 12 is electrically insulating, and the light-emitting element layer 6 is partitioned into the red light-emitting element 6R, the green light-emitting element 6G, and the blue light-emitting element 6B by the bank 12.

For instance, the bank 12 is preferably provided as an edge cover covering an edge of the anode 10. Specifically, the bank 12 is preferably provided either at least partially in contact with an end face of the anode 10 or at least partially on the end face of the anode 10 in a top view. The following description will, for simple description, focus only on the structure in which the bank 12 is disposed partially on the anode 10. Given such a description, a person skilled in the art will easily understand the structure in which the bank 12 is partially adjacent to the anode 10.

The light-emitting layer 24 includes a red light-emitting layer 24R that emits red light, a green light-emitting layer 24G that emits green light, and a blue light-emitting layer 24B that emits blue light. The light-emitting layer 24 may be provided either individually for each light-emitting element or commonly to a plurality of light-emitting elements of the same color.

The light-emitting layer 24 is provided so as to cover at least the corresponding anode 10 exposed in the opening 12A in the bank 12. If the hole transport layer 22 comes into contact with the electron transport layer 26 above the exposed region of the anode 10 or above its vicinity, an invalid current that does not contribute to the emission of light by the light-emitting layer 24 flows through the contact site. Therefore, the light-emitting layer 24 preferably further covers a part of the side face 12S of the bank 12 (specifically, a part that is close to the profile of the corresponding opening 12A). In addition, as shown in FIG. 2, the light-emitting layer 24 can further reduce the invalid current by extensively covering the side face 12S and the top face 12U of the bank 12. More specifically, for example, the light-emitting layer 24 can further reduce the invalid current by covering the entire side face 12S and a part of the top face 12U of the bank 12.

Note that in the structure shown in FIG. 3, the hole transport layer 22 is in direct contact with the electron transport layer 26 above the top face 12U of the bank 12. The direct contact between the hole transport layer 22 and the electron transport layer 26 generally causes an invalid current flow. In the present disclosure, however, this contact is separated by a distance from the exposed region of the anode 10, which restrains invalid current because the electrical resistivity of the charge transport layer and/or the charge injection layer is appreciably larger than the electrical resistivity of typical metals and semiconductors. This large electrical resistance value of the path that extends from the anode 10 through the hole transport layer 22 and/or the electron transport layer 26 to the contact site above the top face 12U of the bank 12 reduces the invalid current that flows through this path to a negligibly small value or practically 0 in the present disclosure. The distance between adjacent light-emitting layers 24 is preferably small to reduce the size of the contact site above the top face 12U of the bank 12. The red light-emitting layer 24R, the green light-emitting layer 24G, and the blue light-emitting layer 24B may be formed so as to overlap each other to eliminate the contact site.

Therefore, in the present embodiment, the red light-emitting element 6R includes: the anode 10R and the cathode 16 facing each other; the bank 12 at least partially adjacent to the anode 10R or at least partially on the anode 10R; the red light-emitting layer 24R between the anode 10R and the cathode 16; the hole injection layer 20 and the hole transport layer 22 between the anode 10R and the red light-emitting layer 24R; and the electron transport layer 26 between the cathode 16 and the red light-emitting layer 24R.

Likewise, the green light-emitting element 6G includes: the anode 10G and the cathode 16 facing each other; the bank 12 at least partially adjacent to the anode 10G or at least partially on the anode 10G; the green light-emitting layer 24G between the anode 10G and the cathode 16; the hole injection layer 20 and the hole transport layer 22 between the anode 10G and the green light-emitting layer 24G; and the electron transport layer 26 between the cathode 16 and the green light-emitting layer 24G.

Likewise, the blue light-emitting element 6B includes: the anode 10B and the cathode 16 facing each other; the bank 12 at least partially adjacent to the anode 10B or at least partially on the anode 10B; the blue light-emitting layer 24B between the anode 10B and the cathode 16; the hole injection layer 20 and the hole transport layer 22 between the anode 10B and the blue light-emitting layer 24B; and the electron transport layer 26 between the cathode 16 and the blue light-emitting layer 24B.

In the present disclosure, "blue light" refers to, for example, light that has a central emission wavelength in the wavelength range of from 400 nm to 500 nm, both inclusive. "Green light" refers to, for example, light that has a central emission wavelength in the wavelength range of from 500 nm exclusive to 600 nm inclusive. "Red light" refers to, for example, light that has a central emission wavelength in the wavelength range of from 600 nm exclusive to 780 nm inclusive.

Note that the light-emitting element layer 6 in accordance with the present embodiment is not limited to this structure and may include an additional layer between the anode 10 and the cathode 16. For example, the light-emitting element layer 6 may further include an electron injection layer between the electron transport layer 26 and the cathode 16. In addition, the light-emitting layer 24 may be capable of emitting light of two or fewer colors and may be capable of emitting light of four or more colors.

The anode 10 and the cathode 16 contain a conductive material, and either one or both of the anode 10 and the cathode 16 is/are a transparent electrode(s). When the display device 2 is a single-sided display, one of the electrodes (the anode 10 and the cathode 16) that is closer to the display screen is a transparent electrode, and the electrode that is farther from the display screen is a reflective electrode. When the display device 2 is a double-sided display, both the anode 10 and the cathode 16 are a transparent electrode. The transparent electrode may be made of a light-transmitting, conductive material. The reflective electrode may be made of a light-reflective, conduction material and may be a stack of a light-transmitting, conductive material and a light-reflective, conduction material.

Examples of the light-transmitting, conductive material include indium tin oxide (ITO), indium zinc oxide (IZO), tin oxide ($SnO_2$), and fluorine-doped tin oxide (FTO). These materials have a high transmittance to visible light and therefore improves the luminous efficiency of the light-emitting element. Examples of the light-reflective, conduction material include aluminum (Al), silver (Ag), copper (Cu), and gold (Au). These materials have a high reflectance to visible light and therefore improves the luminous efficiency of the light-emitting element. Note that a light-reflective, conduction material may be formed with such a small thickness that the material can acquire sufficient light transmittance for use as a light-transmitting, conductive material.

The anode 10 feeds holes to the light-emitting layer 24, whereas the cathode 16 feeds electrons to the light-emitting layer 24. The anode 10 is disposed opposite the cathode 16.

The hole injection layer 20 contains a hole transport material and has a function of injecting holes from the anode 10 to the hole transport layer 22 or the light-emitting layer 24. The hole transport layer 22 contains a hole transport material and has a function of transporting holes from the hole injection layer 20 or the anode 10 to the light-emitting layer 24. Note that either one or both of the hole injection layer 20 and the hole transport layer 22 preferably has/have a function of inhibiting the transport of electrons from the light-emitting layer 24 to the anode 10.

The hole transport material may be selected in a suitable manner from materials commonly used in the field.

The organic hole transport material may be, for example, polystyrene sulfonate-doped polyethylenedioxythiophene (PEDOT:PSS), 4,4',4"-tris(9-carbazoyl)triphenylamine (TCTA), 4,4'-bis [N-(1-naphthyl)-N-phenyl-amino]-biphenyl (NPB), zinc phthalocyanine (ZnPC), di [4-(N,N-ditolylamino)phenyl]cyclohexane (TAPC), 4,4'-bis(carbazol-9-yl) biphenyl (CBP), 2,3,6,7,10,11-hexacyano-1,4,5,8,9,12-hexaazatriphenylene (HATCN), poly(N-vinylcarbazole) (PVK), poly(2,7-(9,9-di-n-octylfluorene)-(1,4-phenylene-((4-sec-butylphenyl)imino)-1,4-phenylene (TFB), or poly (triphenylamine) derivative (Poly-TPD). Among these examples, TFB and like tetracyano compounds, PVK and like carbazole derivatives, and Poly-TPD and like triarylamines derivatives are preferable.

Examples of inorganic hole transport material include materials containing at least one species selected from the group consisting of oxides, nitrides, and carbides each containing at least one of Zn, Cr, Ni, Ti, Nb, Al, Si, Mg, Ta, Hf, Zr, Y, La, Sr, and W. Among these examples, the inorganic hole transport material is preferably an oxide containing at least one of Zn, Cr, Ni, Ti, Nb, Al, Si, Mg, Ta, Hf, Zr, Y, La, and Sr and more preferably at least one species selected from NiO, MgO, MgNiO, LaNiO3, CuO, and Cu2O. Other examples of preferred hole transport materials include CuSCN and like metals in which a CN group, a SCN group, and a SeCN group are bonded to a metal. These materials may be nanoparticles.

Inorganic materials have higher chemical stability than organic materials. The hole injection layer 20 and/or the hole transport layer 22 therefore preferably contain(s) an inorganic hole transport material. Furthermore, the inorganic hole transport material is preferably a metal oxide, in which case the chemical stability increases. The metal oxide may contain either only one metal element or two or more metal elements. When the metal oxide contains two or more metal elements, the electrical conductance of the hole injection layer 20 and/or the hole transport layer 22 can be adjusted by changing the ratio of the metal elements.

The hole injection layer 20 preferably has a thickness of from at least 10 nm to at most 150 nm, both inclusive, in a region corresponding to the opening 12A in the bank 12 for the following reasons. If the thickness is smaller than 10 nm, the hole injection layer 20 may fail to deliver sufficient hole transportability. Meanwhile, if the thickness is greater than 150 nm, the hole injection layer 20 may develop cracks during its manufacture. The cracks can reduce the efficiency of hole injection from the hole injection layer 20 to the hole transport layer 22.

The hole injection layer 20 may include a self-assembled monolayer (SAM) on the surface thereof. The SAM enables reducing the drive voltage of the light-emitting element.

The hole transport layer 22 preferably has a thickness of from at least 10 nm to at most 100 nm, both inclusive, in a region corresponding to the opening 12A in the bank 12 for the following reasons. If the thickness is smaller than 10 nm, the hole transport layer 22 may fail to deliver sufficient hole transportability. Meanwhile, if the thickness is greater than 100 nm, the drive voltage of the light-emitting element rises.

The electron transport layer 26 contains an electron transport material and has a function of transporting electrons from the cathode 16 to the light-emitting layer 24. The electron transport layer 26 preferably has a function of inhibiting the transport of holes from the light-emitting layer 24 to the cathode 16.

The organic electron transport material suited for use as the electron transport layer 26 may be, for example, a compound or complex with at least one nitrogen-containing hetero ring such as an oxadiazole ring, a triazole ring, a triazine ring, a quinoline ring, a phenanthroline ring, a pyrimidine ring, a pyridine ring, an imidazole ring, or a carbazole ring. Specific examples include 1,10-phenanthroline derivatives such as bathocuproine and bathophenanthroline; benzimidazole derivatives such as 1,3,5-tris(N-phenyl benzimidazol-2-yl)benzene (TPBI); metal complexes such as tris(8-quinolinolato)aluminum complexes (Alq3), bis(10-benzoquinolinolato) beryllium complexes, 8-hydroxy quinoline Al complexes, and bis(2-methyl-8-quinolinate)-4-phenyl phenorate aluminum; and 4,4'-biscarbazolebiphenyl. Other examples include aromatic phosphine compounds such as aromatic boron compounds, aromatic silane compounds, and phenyl di(1-pyrenyl)phosphine; bathophenanthroline; bathocuproine; 2,2',2"-(1,3,5-benzenetriyl)-tris(1-phenyl-1-H-benzimidazole) (TPBI); and nitrogen-containing heterocyclic compounds such as triazine derivatives.

The organic electron transport material suited for use as the electron transport layer 26 may alternatively be, for example, a compound with a paraphenylene vinylene backbone. Specific examples include polyparaphenylene vinylene (PPV)-based compounds such as poly(2-2'-ethylhexoxy)-5-methoxy-1,4-phenylene vinylene (POPh-PPV).

The inorganic electron transport material suited for use as the electron transport layer 26 may be, for example, an oxide containing at least one of Zn, Ni, Cr, Mg, Li, Ti, W, Mo, In, and Ga. Among these examples, those oxides which are likely to shift toward oxygen deficiency on the basis of stoichiometric composition are preferred. Examples include zinc oxide (ZnO), magnesium zinc oxide (MgZnO), titanium oxide (TiO2), and strontium oxide (SrTiO3). These materials may be nanoparticles.

Inorganic materials have higher chemical stability than organic materials. The electron transport layer 26 therefore preferably contains an inorganic electron transport material. Furthermore, the inorganic electron transport material is preferably a metal oxide, in which case the chemical stability increases. The metal oxide may contain either only one metal element or two or more metal elements. When the metal oxide contains two or more metal elements, the electrical conductance of the electron transport layer 26 can be adjusted by changing the ratio of the metal elements.

The electron transport layer 26 preferably has a thickness of from at least 10 nm to at most 100 nm, both inclusive, in a region corresponding to the opening 12A in the bank 12 for the following reasons. If the thickness is smaller than 10 nm, the cathode 16 and the light-emitting layer 24 are likely to come into direct contact with each other, causing the thermal deactivation of excitons in the light-emitting layer 24. Meanwhile, if the thickness is greater than 100 nm, pores would form in the pixel surface that should emit uniform light, which may create non-emissive regions.

The transparent electrode, the hole injection layer 20, the hole transport layer 22, and the electron transport layer 26 transmit light in the wavelength range that is used in producing displays on the display device 2.

The light-emitting layer 24 is the layer in which holes from the anode 10 and electrons from the cathode 16 recombine, producing excited light-emitting matter that emit light upon falling to ground state. Applying voltage or current across the anode 10 and the cathode 16 causes the recombination in the light-emitting layer 24, which in turn produces light. The light-emitting layer 24 may contain quantum dots or an organic light-emitting material as the light-emitting matter.

"Quantum dots" refers to dots with a maximum width of less than or equal to 100 nm. The shape of the quantum dots needs only to satisfy this maximum width condition, is not limited in any particular manner, and is not necessarily limited to a spherical solid (circular cross-section). The shape may be, for example, a polygonal cross-section, a virgulate solid, a ramal solid, a solid with a non-flat surface, or a combination of any of these shapes. In the present example, the quantum dots are, as an example, semiconductor fine particles with a particle size of less than or equal to 100 nm and may contain a Group II-VI semiconductor compound such as MgS, MgSe, MgTe, CaS, CaSe, CaTe, SrS, SrSe, SrTe, BaS, BaSe, BaTe, ZnS, ZnSe, ZnTe, CdS, CdSe, CdTe, HgS, HgSe, or HgTe; and/or crystals of a Group III-V semiconductor compound such as GaAs, GaP, InN, InAs, InP, or InSb; and/or crystals of a Group IV semiconductor compound such as Si or Ge. In addition, the quantum dots may have, for example, a core/shell structure including these semiconductor crystals, as the core, that are overcoated with a shell material that has a large bandgap. Furthermore, the quantum dots may have ligands adsorbed (coordinated) to their surface. Note that the shell does not necessarily completely cover the core and may be formed on a part of the core. In addition, by the light-emitting layer 24 containing the quantum dots and a compound that can form ligands, this compound may be regarded as ligands adsorbed (coordinated) to the surface of the quantum dots.

When the bank 12 is electrically insulating, the bank 12 may contain an insulating material. The bank 12 may contain, for example, a polyimide resin, an acrylic resin, a novolac resin, or a fluorene resin. The bank 12 may be formed by, for example, patterning a photosensitive resin material by photolithography. The photosensitive resin may be either of a negative type or of a positive type.

The sealing layer 8 covers the light-emitting element layer 6 to seal the light-emitting elements in the display device 2. The sealing layer 8 reduces permeation of, for example, moisture and oxygen into the light-emitting element layer 6 from outside the display device 2 through the sealing layer 8. The sealing layer may have, for example, a layered structure including an inorganic sealing film made of an inorganic material and an organic sealing film made of an organic material. The inorganic sealing film is formed, for example, by CVD and includes a silicon oxide film, a silicon nitride film, a silicon oxynitride film, or a stack of any of these films. The organic sealing film is made of, for example, polyimide or a like resin material that can be provided by printing or coating technology.

Thickness of Electron Transport Layer and Angle of Inclination of Bank

Figure 4:
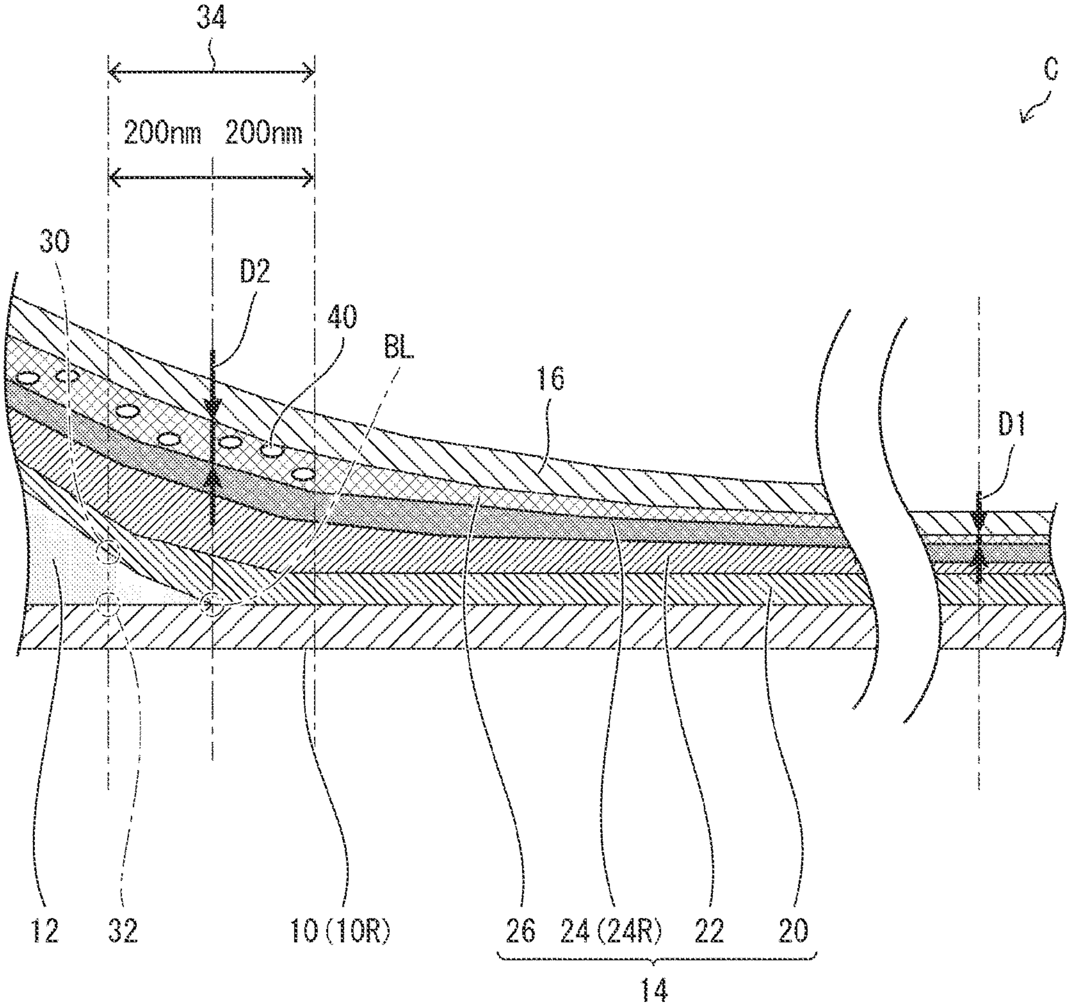
FIG. 4 is a schematic enlarged cross-sectional view of a structure of an active layer shown in FIG. 3.

FIG. 4 is a schematic enlarged cross-sectional view of a structure of the active layer 14 shown in FIG. 3. FIG. 4 is an equivalent of an enlarged cross-sectional view of region C indicated by surrounding in FIG. 3. Note that FIG. 4 shows only the anode 10R, the bank 12, the active layer 14, and the cathode 16, with the other structural elements omitted, to focus the description on the electron transport layer 26 in the active layer 14.

Figure 5:
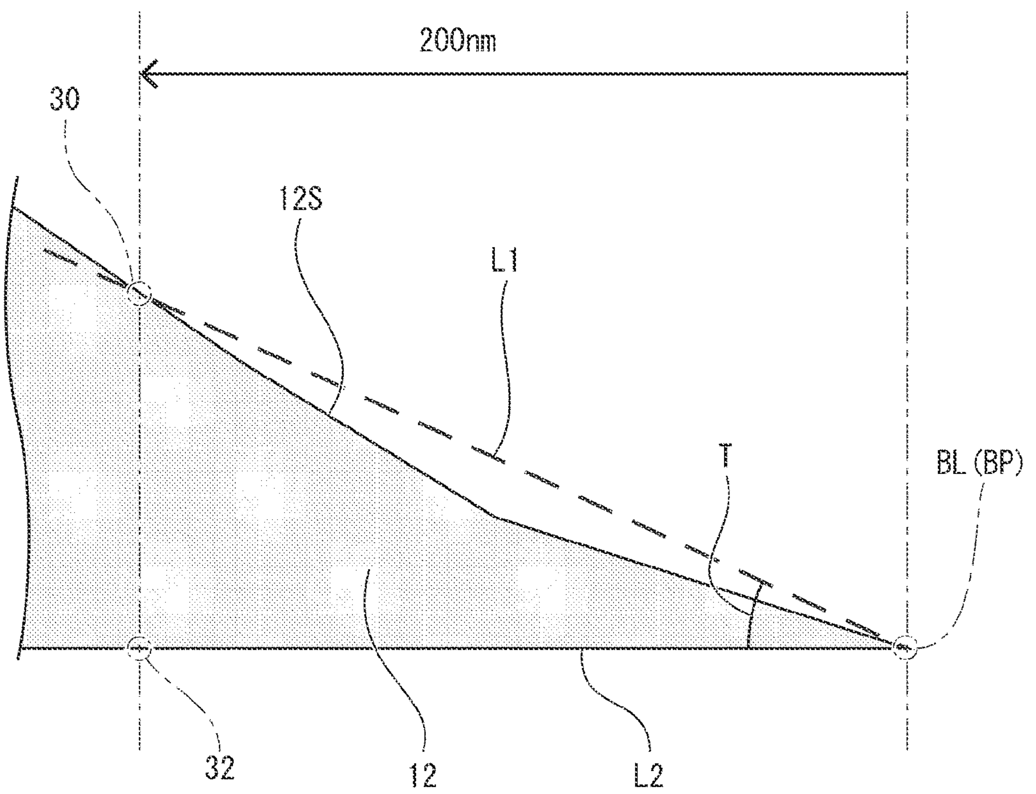
FIG. 5 is a schematic diagram illustrating an angle of inclination T of a bank shown in FIG. 3.

FIG. 5 is a schematic diagram illustrating an angle of inclination T of the bank 12 shown in FIG. 3.

Referring to FIG. 4, in the light-emitting element layer 6 in accordance with the present disclosure, the thickness of at least the electron transport layer 26 is non-uniform. The thickness of at least one of the hole injection layer 20, the hole transport layer 22, and the red light-emitting layer 24R may be additionally non-uniform, and the side face 12S of the bank 12 may be non-flat.

Let D1 stand for the thickness of the electron transport layer 26 taken above the center of the anode 10 and perpendicular to the top face of the anode 10. Likewise, let D2 stand for the thickness of the electron transport layer 26 taken above a boundary line BL between the anode 10 and the bank 12. Let T stands for the angle of inclination of the bank 12. A vicinity of the boundary line BL, including the boundary line BL, is termed a vicinity region 34.

In the current context, the center of the anode 10 is the center of the opening 12A in the bank 12. More specifically, in relation to the center of the opening 12A in the bank 12, the bank 12 has: a first portion either adjacent to a first end that is an end of the anode 10 in a cross-section or on the first end; and a second portion either adjacent to a second end that is an end of the anode 10 opposite the first end or on the second end. The center of the anode 10, in a cross-section across the first portion and the second portion, is the midpoint of a line segment that links the lower end of the first portion of the bank 12 on the anode 10 side to the lower end of the second portion of the bank 12 on the anode 10 side. Attention should be paid to the fact that the center of the opening 12A in the bank 12 may not match the center of the top face of the anode 10. When the center of the opening 12A in the bank 12 differs from the center of the top face of the anode 10, the center of the opening 12A in the bank 12 should be adopted. The angle of inclination T of the bank 12 is the angle between the side face 12S and the top face, of the anode 10, that is external to the boundary line BL (or an imaginary face that is an extension of the top face). The vicinity region 34 contains the boundary line BL.

Referring to FIG. 5, when the side face 12S is non-flat, an imaginary flat face that is close to the side face 12S may be used in place of the side face 12S. Assume, as an example, a cross-section that contains a normal to the side face 12S of the bank 12 and a normal to the top face of the anode 10 in a location distanced by 200 nm externally to the boundary line BL. A point on the boundary line BL in this cross-section is a boundary point BP. Additionally, in the cross-section, a point on the side face 12S of the bank 12 distanced by 200 nm externally to the boundary point BP is termed an upper end point 30, and a point on the top face of the anode 10 distanced by 200 nm externally to the boundary point BP (or imaginary face that is an extension of the top face) is termed a lower end point 32. Then, the angle between line segment L1 that links the upper end point 30 to the boundary point BP and line segment L2 that links the lower end point 32 to the boundary point BP is the angle of inclination T.

Throughout the present disclosure, the terms, "film thickness" and "thickness," refer to the thickness measured in a direction normal to the top face of the anode 10R unless otherwise mentioned explicitly. The "boundary line BL" refers to a boundary line between the top face of the anode 10 and the side face 12S of the bank 12. The boundary line BL is also a profile line of the opening 12A in the bank 12. The language, "internal to the boundary line BL" (or "internal to the boundary point BP"), refers to the inside of the opening 12A in the bank 12 from the boundary line BL (or from the boundary point BP), whereas the language, "external to the boundary line BL" (or "external to the boundary point BP"), refers to the outside of the opening 12A in the bank 12 from the boundary line BL (or from the boundary point BP).

In the current context, the angle of inclination T may be such that 0°<T<90°, 0°<T<70°, or 0°<T<40°. The angle of inclination T preferably satisfies 0°<T<50° to reduce the breakage of the light-emitting layer 24 and the cathode 16 caused by a step in the bank 12.

For instance, if the light-emitting layer 24 is broken up due to such a step, the hole transport layer 22 and the electron transport layer 26 come into contact above, or above a vicinity of, the exposed region of the anode 10. The electric current that flows through the contact is an invalid current that does not contribute to the emission of light by the light-emitting layer 24. In addition, for example, if the cathode 16 is broken up due to a step, insulation may occur, or electrical resistance rises, inside the cathode 16. The breakage of the light-emitting layer 24 and the cathode 16 caused by a step is preferably reduced to prevent these events.

Referring to FIG. 4, the electron transport layer 26 has pores 40 above the vicinity region 34 of the boundary line BL and in contrast, no pores 40 internal to the vicinity region 34, for example, above the center of the anode 10. The vicinity region 34, as an example, includes a region parallel to the top face of the anode 10, the region spreading up to approximately 200 nm from the boundary line BL both internally and externally to the boundary line BL. In addition, in relation to the electron transport layer 26, the vicinity region 34 may be assumed to include, as an example, parts of the electron transport layer 26 that have a thickness that is greater than or equal to 1.4 times D1 (thickness above the center).

Separation of Elements

The following will describe the electrical resistance of the electron transport layer 26. Let $\rho_{ETL}$ represent the electrical resistivity per volume of the material constituting the electron transport layer 26, and $\rho_{metal}$ represent the electrical resistivity per volume of a typical metal and semiconductor.

The electrical resistivity, $\rho_{metal}$, of a typical metal and semiconductor is sufficiently low. Therefore, the electric charge carrier such as electrons and holes can move not only parallel to electric lines of force, but also in directions that intersect with the electric lines of force, inside the typical metal and semiconductor. In contrast, the electrical resistivity of the charge transport material is significantly higher than the electrical resistivity of the typical metal and semiconductor. Therefore, the electrical resistivity, $\rho_{ETL}$, of the material constituting the electron transport layer 26 is much higher than the typical metal and semiconductor ($\rho_{metal} \ll \rho_{ETL}$). Therefore, practically, electrons can move only parallel to the electric lines of force inside the electron transport layer 26.

The pores 40 block movement of electric charges. As described above, since electrons generally move parallel to the electric lines of force inside the electron transport layer 26, electrons are unlikely to bypass the pores 40. Therefore, the pores 40 reduce the effective cross-sectional area of the electron transport layer 26 through which electrons can travel, thereby increasing the effective electrical resistance value of the electron transport layer 26 in a direction along the electric lines of force.

The electric lines of force are substantially parallel to the side face 12S of the bank 12 externally to the boundary line BL, in other words, above the side face 12S of the bank 12. In addition, the electric lines of force are substantially perpendicular to the top face of the anode 10 internally to the boundary line BL, in other words, above the top face of the anode 10.

The regions internal to the electron transport layer 26 are hence electrically separated from the regions external to the electron transport layer 26.

The following will describe the electrical resistance of the electron transport layer 26 in more detail.

Figure 6:
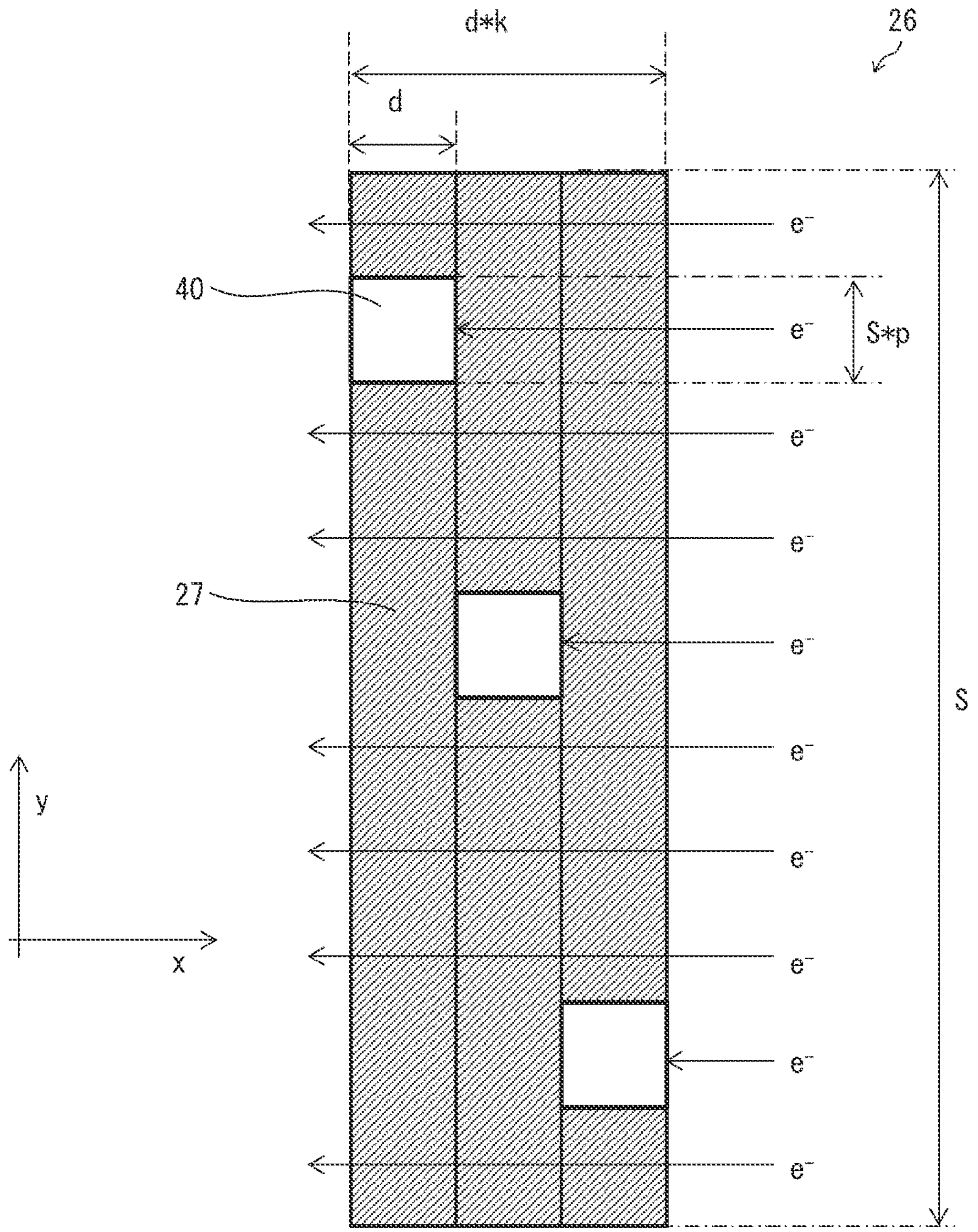
FIG. 6 is a schematic diagram representing modeling of a functional layer with pores in accordance with the present disclosure.

FIG. 6 is a schematic diagram representing modeling of the electron transport layer 26 with the pores 40.

Figure 7:
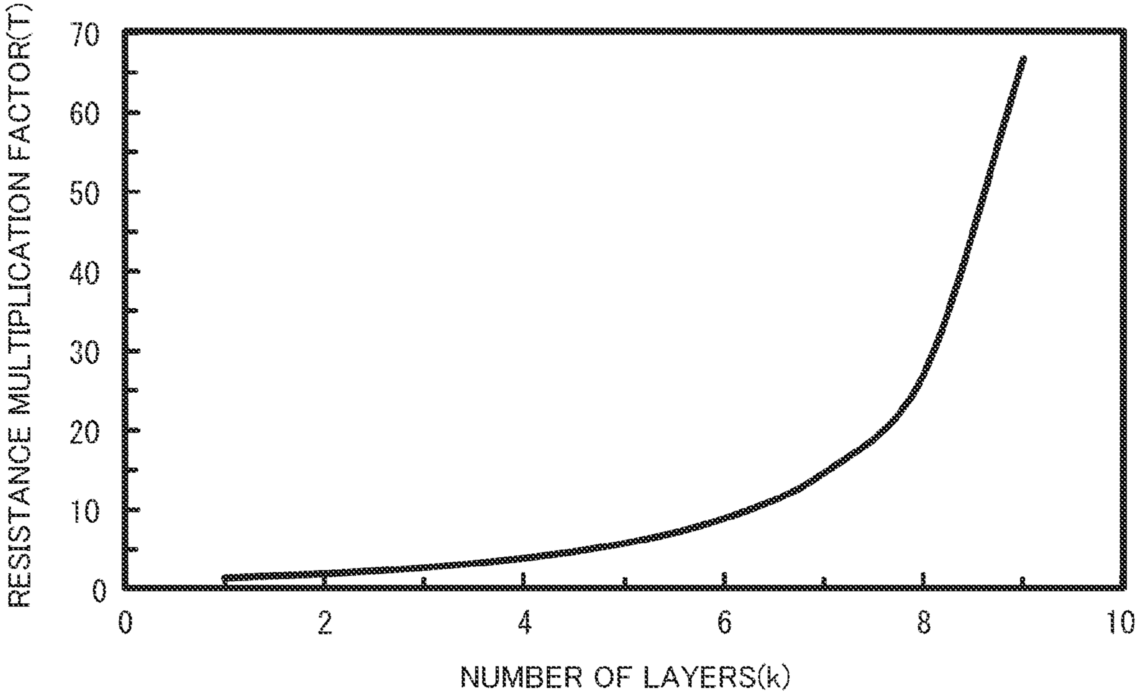
FIG. 7 is a graph representing the multiplication factor for the effective electrical resistance value of the modeled functional layer shown in FIG. 6, measured parallel to electric lines of force when the functional layer has a porosity of 0.1.

FIG. 7 is a graph representing the multiplication factor for the effective electrical resistance value of the modeled electron transport layer 26 shown in FIG. 6, measured parallel to electric lines of force when the electron transport layer 26 has a porosity of 0.1. The horizontal axis in FIG. 7 shows the number of layers (k) observed when the electron transport layer 26 is sliced along a plane perpendicular to the electric lines of force. The vertical axis in FIG. 7 shows the multiplication factor (U) of the effective electrical resistance value ($R_{eff}$) of the electron transport layer 26 with the pores 40 to the electrical resistance value ($R_0$) of the electron transport layer 26 with no pores 40.

The electron transport layer 26 is modeled by a stack body in which k slice pieces 27 are stacked parallel to the electric lines of force (x-direction) as shown in FIG. 6. In this model, the slice pieces 27 have pores 40, an equal porosity p, an equal thickness d parallel to the electric lines of force, and an equal nominal cross-sectional area S in the cross-section that is perpendicular to the electric lines of force and that includes the pores 40. In addition, the dimension of the pores 40 parallel to the electric lines of force is equal to the thickness d. In addition, the electric field applied to the electron transport layer 26 is a temporally and spatially uniform DC electric field.

Regarding parameters, d and S are greater than 0, k is a natural number, and p is from 0 inclusive to 1 exclusive. In addition, "*" is used as the symbol that represents a multiplication.

In the model defined above, letting $S_{eff}(p,k,S)$ represent the effective cross-sectional area of the electron transport layer 26 through which electrons can travel and $R_{eff}(d,p,k,S)$ represent the effective electrical resistance value of the electron transport layer 26 to the movement of electrons, the following equations (1) to (2) hold.

$$S_{eff}(p, k, S) = S * (1 - p)^k \quad (1)$$

$$R_{eff}(d, p, k, S) = \rho_{ETL} * d * k / S_{eff}(p, k, S) \quad (2)$$

Following equation (3) is obtained by combining equations (1) to (2).

$$R_{eff}(d, p, k, S) = \rho_{ETL} * d * k * (1 - p)^{-k} / S \quad (3)$$

Letting $R_0(k,S)$ represent the electrical resistance value of the electron transport layer 26 with no pores 40, following equation (4) holds.

$$R_0(d, k, S) = \rho_{ETL} * d * k / S \quad (4)$$

Letting U(p,k) represent the multiplication factor of the effective electrical resistance value ($R_{eff}$) of the electron transport layer 26 with the pores 40 to the electrical resistance value ($R_0$) of the electron transport layer 26 with no pores 40, following equation (5) holds.

$$U = R_{eff}(d, p, k, S) / R_0)(d, k, S) \quad (5)$$

Following equation (6) is obtained by combining equations (3) to (5).

$$U(p, k) = (1 - p)^{-k} \quad (6)$$

Referring to FIG. 7, since $0 \le p < 1$ and k is a natural number, U>1 and exponentially increases with an increase in p and k. The nominal cross-sectional area S of the electron transport layer 26 linearly increases with an increase in the thickness of the electron transport layer 26.

As described above, the electron transport layer 26 has the pores 40 above the vicinity region 34 and no pores internal to the vicinity region 34. In view of manufacturing conditions such as the angle of inclination T of the bank 12 and the surface tension of the component solution for the electron transport layer 26, it is difficult to render the thickness of the vicinity region 34 of the boundary line BL significantly greater than several times D1 (thickness at the central portion).

Therefore, the multiplication factor of the effective electrical resistance value of the electron transport layer 26 above the vicinity region 34 to the effective electrical resistance value of the electron transport layer 26 above the center is large due to the exponential increases of U(p,k). Therefore, as described above, the regions internal to the electron transport layer 26 are electrically separated from the regions external to the electron transport layer 26.

This electrical separation reduces or practically eliminates the leakage current that flows through the electron transport layer 26. The decrease in the leakage current in turn increases the effective electric current, that is, the fraction of the electric current applied to the target light-emitting element that contributes to the emission of light by the target light-emitting element. The increase in the effective electric current increases the luminous efficiency of the light-emitting element in accordance with the present disclosure. In addition, the decrease in the leakage current renders the light-emitting layer 24 more likely to emit light only internally to the boundary line BL, thereby reducing intense annular emission of light (abnormal emission of light) by the light-emitting layer 24 along the boundary line BL. The decrease in the leakage current also reduces the emission of light (crosstalk) by the light-emitting elements adjacent to the target light-emitting element.

Furthermore, the electrical separation in the electron transport layer 26 electrically separates the light-emitting elements adjacent to the electron transport layer 26 from each other. It is therefore unnecessary to perform patterning on the hole injection layer 20, the hole transport layer 22, and the electron transport layer 26. The hole injection layer 20, the hole transport layer 22, and the electron transport layer 26 therefore can be formed by simple steps, and the light-emitting elements and the display device 2 can be manufactured at a low cost. The etching step, rinsing step, and resist layer for the patterning degrade the performance of the charge transport material. Therefore, the hole injection layer 20, the hole transport layer 22, and the electron transport layer 26 can achieve high performance, and the light-emitting element in accordance with the present disclosure can achieve high luminous efficiency. Meanwhile, in related art, separation of elements is performed by patterning at least one of the charge transport layer and the charge injection layer for each light-emitting element.

Measurement of Porosity

The porosity of a portion of the electron transport layer 26 represents the ratio of the cross-sectional area of the pores 40 to the cross-sectional area of that portion of the electron transport layer 26.

The following will describe an exemplary porosity measuring method.

First, the light-emitting element layer 6 is cut along a plane perpendicular to the top face of the anode 10, and an image is captured of the resultant cutting plane under a scanning electron microscope (SEM).

Next, a region including the electron transport layer 26 above the vicinity region 34 of the boundary line BL is extracted from the captured image as an original image 50 and then enlarged. The region of the electron transport layer 26 included in the original image 50 is preferably only a region including the pores 40.

Next, the electron transport layer 26 is extracted from the original image 50. This extraction may be based on a human visual evaluation, a judgement by a computer or an artificial intelligence (AI), or a human evaluation assisted by a computer or an (AI). Specifically, a line that passes between pixels at which the pixel luminance distribution exhibits the most steep change is a candidate of the profile line of the electron transport layer 26. The regions of the original image 50 outside the electron transport layer 26 are rendered white as a background.

Next, the boundaries of the pores 40 are extracted from the electron transport layer 26 by contrast evaluation. Specifically, adjacent pixels are determined to correspond to a boundary of a pore when the adjacent pixels have a contrast difference that is greater than or equal to a threshold value. The threshold value is, for example, determined by the percentile method. A luminance histogram of all the pixels is plotted, and the intermediate value of the highest luminance and the lowest luminance in the histogram is designated the threshold value.

Next, a black and white (binary) image is made of the cross-section of the electron transport layer 26. Specifically, those pixels that are determined to correspond to the boundaries of the pores 40 and those pixels contained in regions surrounding the pixels determined to correspond to the boundaries of the pores are rendered white. On the other hand, the other pixels inside the electron transport layer 26 are rendered black.

Next, the white pixels and the black pixels inside the electron transport layer 26 are counted, and the porosity is calculated. Here, porosity=white pixel count/(white pixel count+black pixel count).

Example of Method of Manufacturing Display Device

Figure 8:
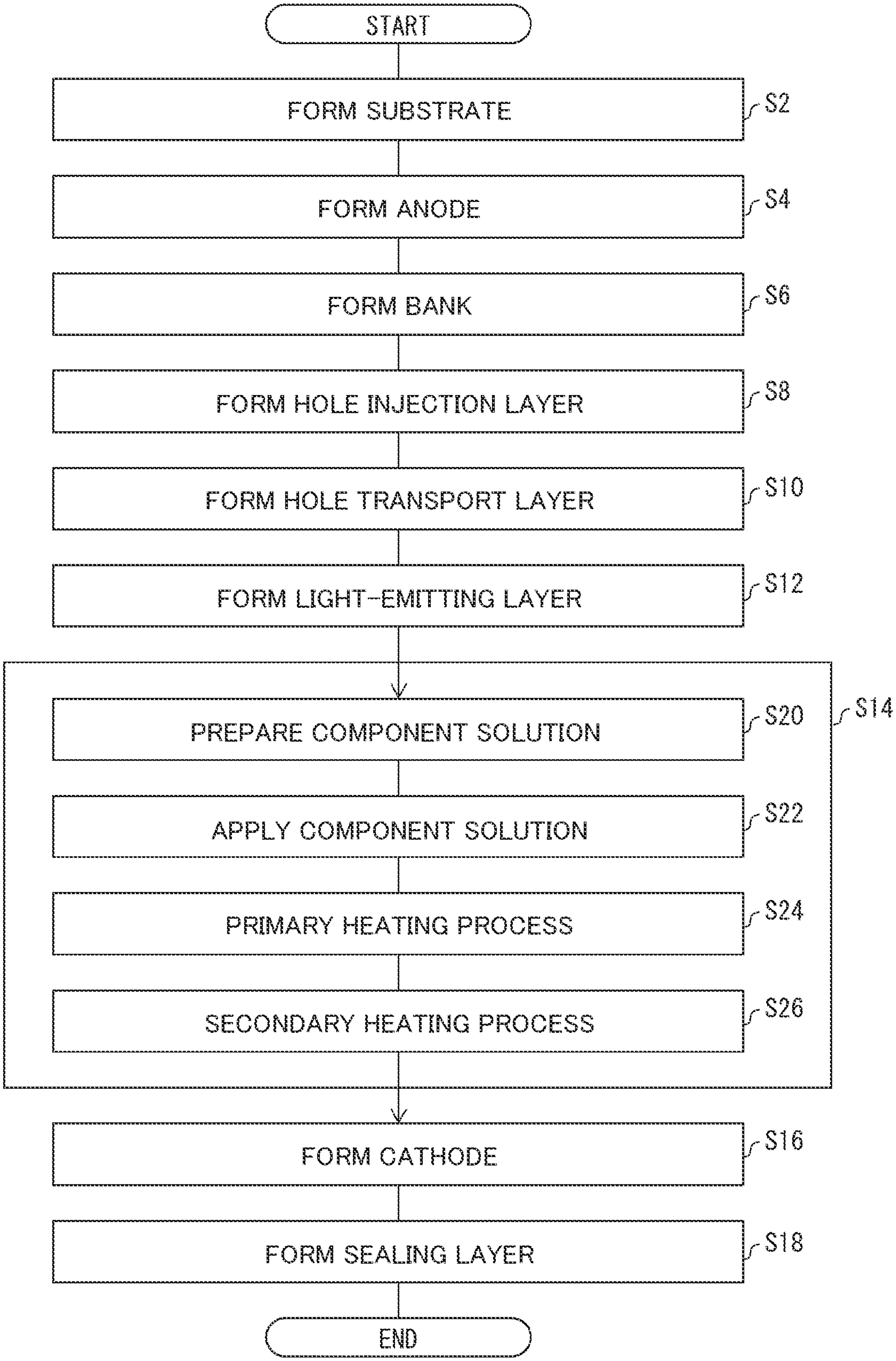
FIG. 8 is a schematic flow chart representing an exemplary method of manufacturing a display device in accordance with an embodiment of the present disclosure.

FIG. 8 is a schematic flow chart representing an exemplary method of manufacturing the display device 2 in accordance with the present embodiment.

Figure 9:
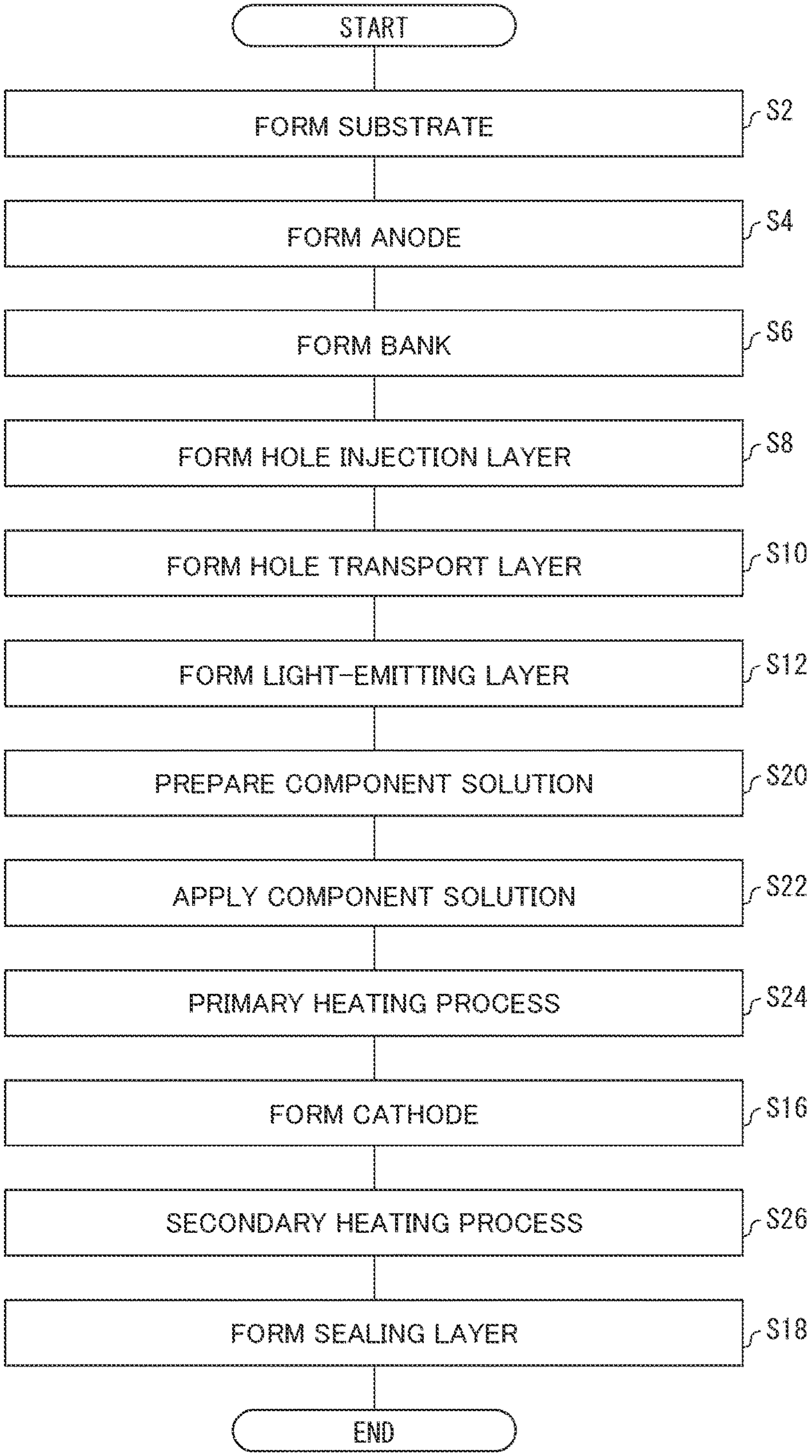
FIG. 9 is a schematic flow chart representing another exemplary method of manufacturing a display device in accordance with an embodiment of the present disclosure.

FIG. 9 is a schematic flow chart representing another exemplary method of manufacturing the display device 2 in accordance with the present embodiment.

Figure 10:
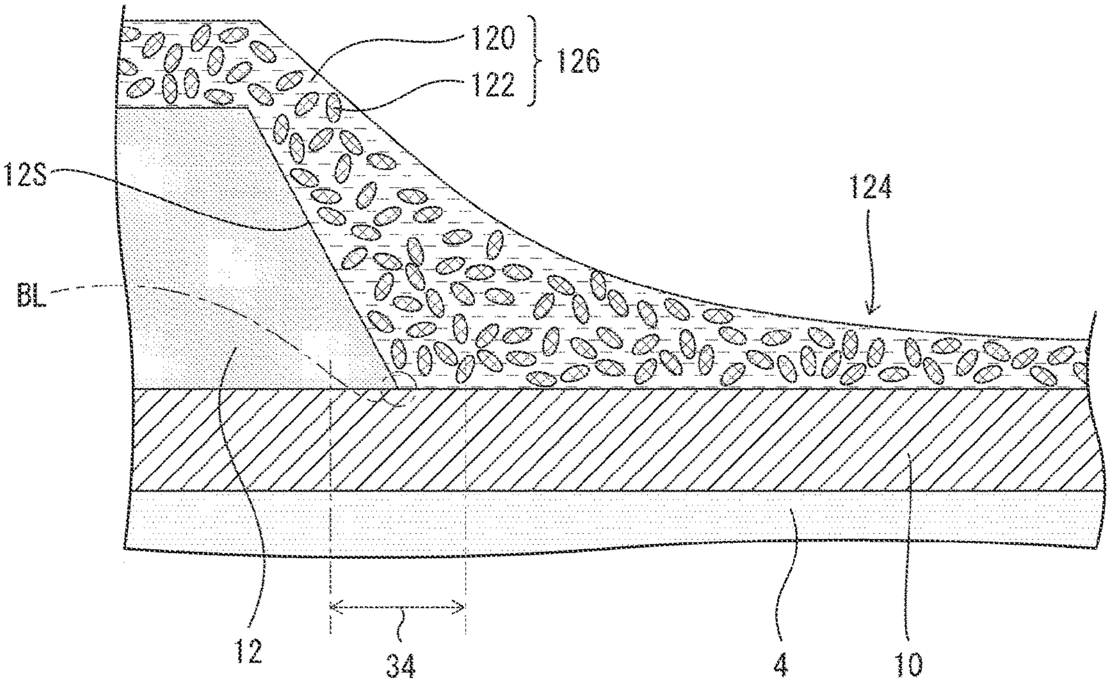
FIG. 10 is a schematic diagram illustrating how the pores are formed in a functional layer in accordance with the present disclosure.
Figure 11:
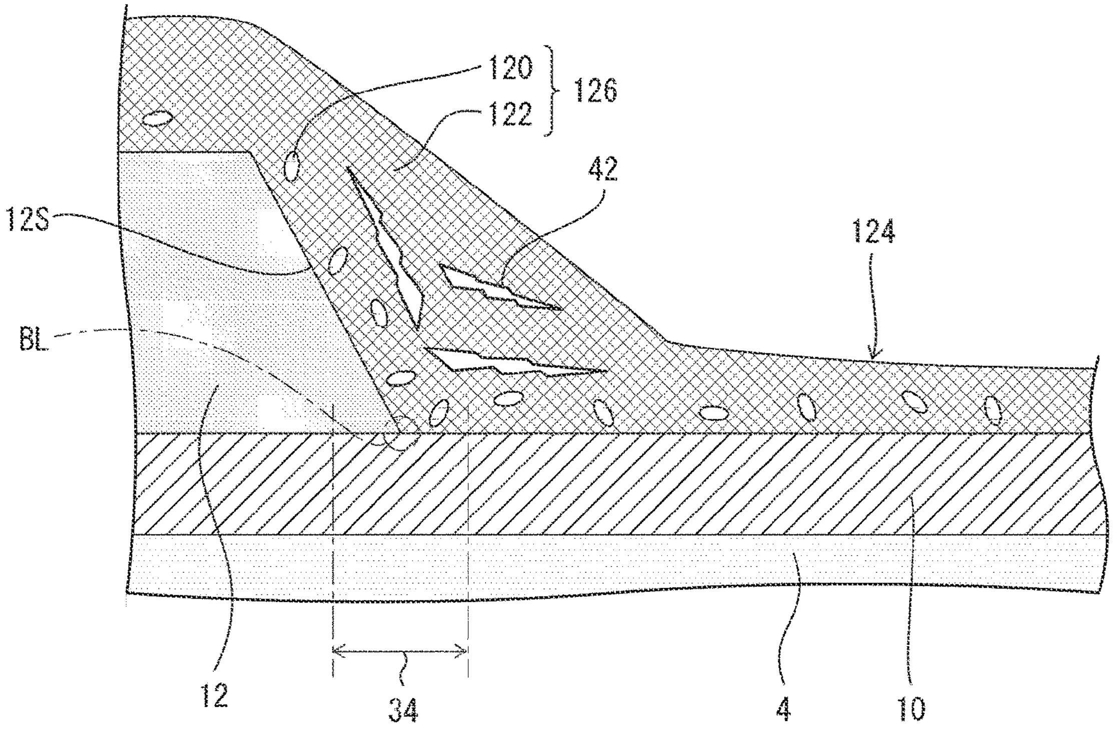
FIG. 11 is a schematic diagram illustrating how the pores are formed in a functional layer in accordance with the present disclosure.
Figure 12:
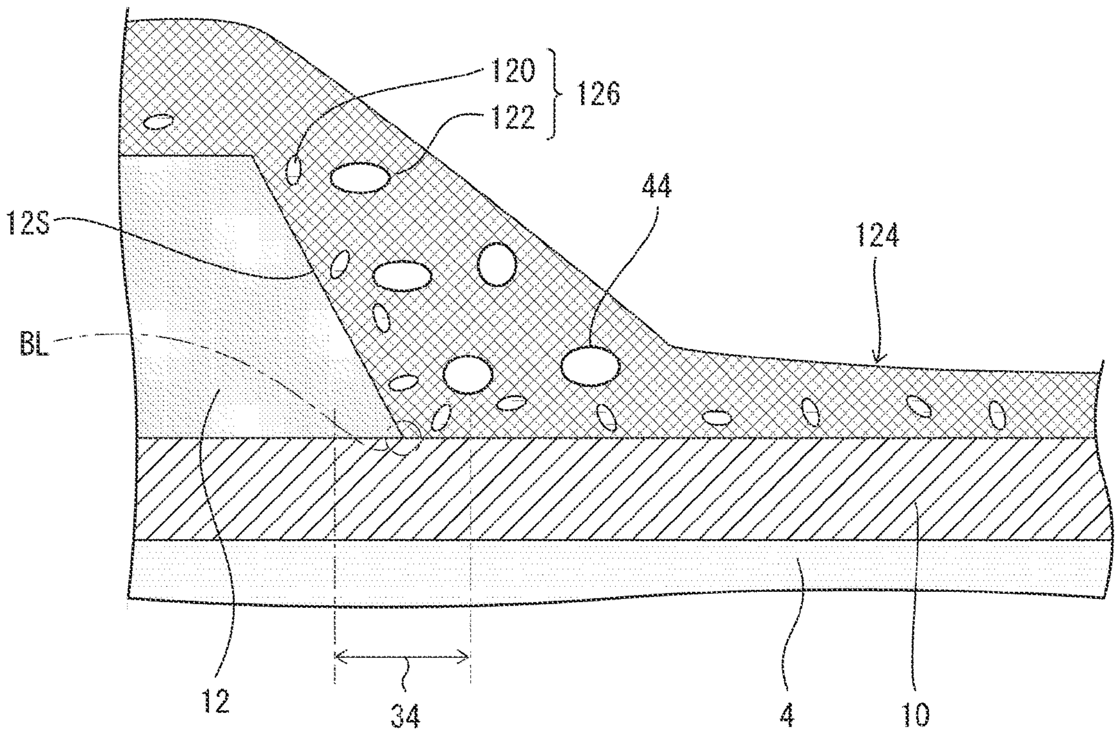
FIG. 12 is a schematic diagram illustrating how the pores are formed in a functional layer in accordance with the present disclosure.

FIGS. 10 to 12 are schematic diagrams illustrating how the pores 40 are formed in the electron transport layer 26. Note that tor simple graphical representation, only the substrate 4, the anode 10, the bank 12, and a third coating film 124 made from a third component solution 126 are illustrated in FIGS. 10 to 12, with the other structural elements omitted.

A heating process in the present disclosure may be performed either in the air or in an inert gas. Ether technique may be selected in a suitable manner.

Referring to FIG. 8, the substrate 4 is formed first in the method of manufacturing the display device 2 in accordance with the present embodiment (step S2). The substrate 4 may be formed by, for example, forming a film base member on a rigid glass substrate and TFTs on this film base member and subsequently lifting the glass substrate from the film base member. This lifting of the glass substrate may be performed after the light-emitting element layer 6 and the sealing layer 8 are formed (detailed later). Alternatively, the substrate 4 may be formed by, for example, forming the TFTs directly on the rigid glass substrate.

Next, the anode 10 is formed on the substrate 4 (step S4). The anode 10 may be formed by, for example, forming a thin film of a metal material by, for example, sputtering and vacuum vapor deposition and subsequently patterning this thin film by dry etching or wet etching using a photoresist. Hence, the anode 10R, the anode 10G, and the anode 10B are obtained in an insular manner for each subpixel on the substrate 4.

Next, the bank 12 is formed (step S6). In step S6, the bank 12 is formed by performing photolithography on a positive photosensitive resin. Specifically, a positive photosensitive resin that is a material for the bank 12 is applied to, for example, the top face of the substrate 4 and the anode 10. Next, a photomask with transparent regions in locations corresponding to the subpixels is placed above the applied photosensitive resin, and, for example, ultraviolet light is projected through the photomask. Next, the photosensitive resin irradiated with the ultraviolet light is rinsed in a suitable development solution. Hence, the bank 12 is formed between the locations corresponding to the subpixels on the substrate 4.

The area and intensity of exposure to light of the photomask in a plan view generally tend to decrease with an increasing distance between the photomask and the object exposed to light. Therefore, when the bank 12 is formed by photolithography using a positive photosensitive resin, the bank 12 is formed with a size that gradually decreases upward from the substrate 4. Therefore, the bank 12 with a forward-tapering side face 20S can be formed in step S6 by forming the bank 12 by applying, exposing to light, and developing the positive photosensitive resin.

Next, the hole injection layer 20 is formed (step S8). In the formation of the hole injection layer 20, for example, a first component solution is obtained by dissolving an inorganic hole transport material in a medium, a first coating film is obtained by applying this first component solution onto the bank 12 and the anode 10, and the hole injection layer 20 is obtained by solidifying the first coating film in, for example, a heating process. The heating process vaporizes the medium, thereby removing the medium from the first coating film. Then, the hole injection layer 20 is cooled either naturally or forcefully. The structural elements formed before the hole injection layer 20 are also heated and cooled in the heating and cooling processes.

Next, the hole transport layer 22 is formed (step S10). In the formation of the hole transport layer 22, for example, a second component solution is obtained by dissolving an organic hole transport material in a medium, a second coating film is obtained by applying this second component solution onto the hole injection layer 20, and the hole transport layer 22 is obtained by solidifying the second coating film in, for example, a heating process. The heating process vaporizes the medium, thereby removing the medium from the second coating film. Then, the hole transport layer 22 is cooled either naturally or forcefully. The structural elements formed before the hole transport layer 22 are also heated and cooled in the heating and cooling processes.

Next, the light-emitting layer 24 is formed (step S12). The light-emitting layer 24 may be formed by any method. For example, the red light-emitting layer 24R may be formed and patterned by inkjet printing technology. Alternatively, for example, the red light-emitting layer 24R may be formed by printing or coating technology using, for example, a spin coater and patterned by photolithography. As an alternative example, the red light-emitting layer 24R may be formed and patterned by vapor deposition using a fine metal mask (FMM).

Next, the electron transport layer 26 is formed (step S14).

Referring to FIGS. 8 and 10, in the formation of the electron transport layer 26, for example, the third component solution 126 is obtained by dissolving a solute 122 containing an electron transport material in a solvent 120 (step S20), and the third coating film 124 is obtained by applying this third component solution 126 onto the light-emitting layer 24 and the hole transport layer 22 (step S22). In step S22, the third coating film 124 is formed so that the third coating film 124 above the vicinity region 34 of the boundary line BL is thicker than the third coating film 124 above the center of the anode 10 by the meniscus effect.

Referring to FIG. 8, subsequently, for example, the electron transport layer 26 is obtained by subjecting the third coating film to a primary heating process (step S24) and a secondary heating process (step S26) in this order. The secondary heating process rapidly raises the temperature. The heating processes vaporize the medium, thereby removing the medium from the third coating film. Additionally, an optional thermal insulation process during which the third coating film 124 is maintained at a constant temperature may be performed after the secondary heating process. The third coating film 124 is further solidified during the thermal insulation. Then, the electron transport layer 26 is cooled either naturally or forcefully. The structural elements formed before the electron transport layer 26 are also heated and cooled in the heating and cooling processes.

Referring to FIG. 11, as an example, cracks 42 develop in the third coating film 124 in steps S24 and S26. First, the third coating film 124 is solidified to a hardly flowable level in the primary heating process. The semi-solidified third coating film 124 adheres to the underlayer layer. The underlayer layer of the third coating film 124 includes the light-emitting layer 24 formed on the top face of the anode 10 and on the side face 12S of the bank 12. This adhesion restricts deformation of the third coating film 124. Subsequently, the semi-solidified third coating film 124 rapidly solidifies and expands in the secondary heating process.

Stress develops inside the third coating film 124 during the secondary heating process due to the deformation restriction and thermal expansion. The deformation restriction is substantially constant regardless of the thickness of the third coating film 124. Meanwhile, the thermal expansion of the third coating film 124 increases with an increases in the thickness of the third coating film. The third coating film 124 above the vicinity region 34 of the boundary line BL is thicker than the third coating film 124 above the center of the anode 10 by the meniscus effect.

As a result, the internal stress is larger above the vicinity region 34 of the boundary line BL than above the central portion of the anode 10. The internal stress above the vicinity region 34 of the boundary line BL increases more rapidly than can be alleviated by the plastic deformation and/or elasticity deform of the solidifying third coating film 124, due to rapidly rising temperature. The internal stress causes the cracks 42 in the third coating film 124 above the vicinity region 34 of the boundary line BL. In addition, the internal stress causes growth of the cracks 42. Then, the cracks 42 are made permanent by the solidification of the third coating film 124 and reduced in size and/or deformed in a cooling process, thereby remaining as the pores 40 in the electron transport layer 26. On the other hand, no cracks 42 develop internal to the vicinity region 34 of the boundary line BL.

Referring to FIG. 12, as an example, bubbles 44 develop in the third coating film 124 in steps S24 and S26. First, the third coating film 124 is solidified to a hardly flowable level in the primary heating process. Subsequently, the medium 120 rapidly evaporates and expands inside the semi-solidified third coating film 124 in the secondary heating process.

The velocity at which the medium 120 that evaporates from the surface of the third coating film 124 into the atmosphere can disperse is substantially constant irrespective of the thickness of the third coating film 124. Meanwhile, the quantity of the medium 120 that evaporates inside the third coating film 124 increases with an increases in the thickness of the third coating film 124.

As a result, the evaporated medium 120 forms the bubbles 44 because the evaporation of the medium 120 exceeds the dispersion thereof due to the thick, third coating film 124 above the vicinity region 34 of the boundary line BL. In addition, the formed bubbles 44 grow. Then, the bubbles 44 are made permanent by the solidification of the third coating film 124 and reduced in size and/or deformed in a cooling process, thereby remaining as the pores 40 in the electron transport layer 26. On the other hand, no bubbles 44 develop internal to the vicinity region 34 of the boundary line BL.

Whether the pores 40 originate from the cracks 42 or the bubbles 44 can be estimated from the shape of the pores 40. Specifically, the pores 40 are estimated to originate from the cracks 42 when the pores 40 have such a shape as a zigzagging, wobbling, or elongated, or a shape with an acute angle on the profile line. Meanwhile, the pores 40 are estimated to originate from the bubbles 44 when the pores 40 are circular or elliptical or have such a shape as a shape observable when circles or ellipses have assembled or a shape observable when circles or ellipses have collapsed.

Figure 13:
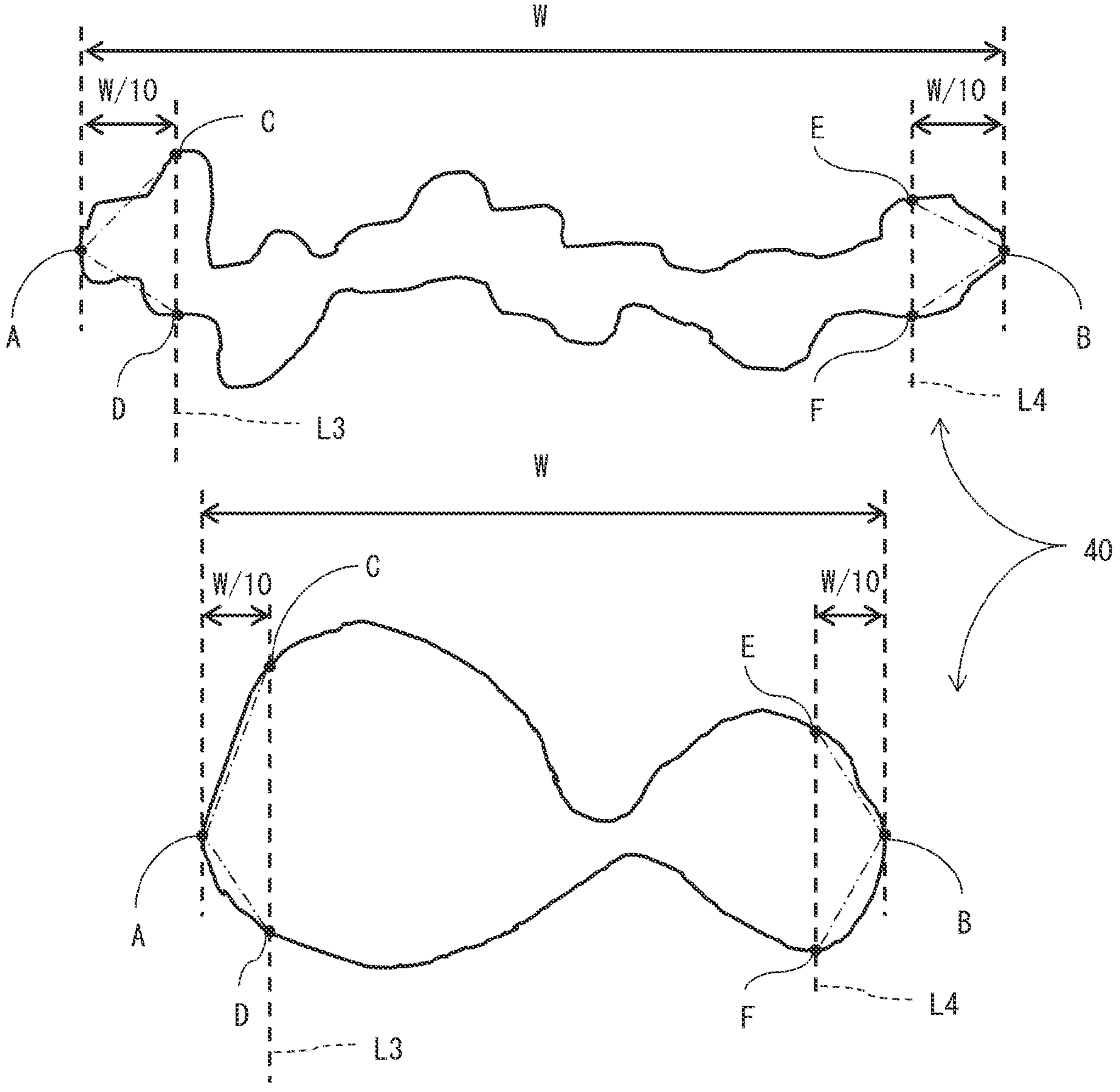
FIG. 13 is a schematic cross-sectional view of exemplary pores in a cross-sectional SEM image of a functional layer in accordance with the present disclosure.

FIG. 13 is a schematic cross-sectional view of an example of the pore 40 in a cross-sectional SEM image of the electron transport layer 26.

Referring to FIG. 13, let point A and point B be two points on the profile line of the pore 40 that are separated by a maximum linear distance in the cross-sectional SEM image and W be the linear distance between point A and point B. Linear line L3 is drawn perpendicular to line segment AB to pass through a location on line segment AB distanced by W/10 from point A. Linear line L4 is drawn perpendicular to line segment AB to pass through a location on line segment AB distanced by W/10 from point B. Then, let point C and point D be the intersections of linear line L3 and the profile line of the pore 40 and point E and point F be the intersections of linear line L4 and the profile line of the pore 40.

Note that when linear line L3 has three or more intersections with the profile line of the pore 40, point C is one of the intersections that is the closest to point A along the profile line in a first direction and point D is one of the intersections that is the closest to point A along the profile line in a second direction. The first direction may be either of the clockwise direction and the counterclockwise direction. The second direction is opposite the first direction. Likewise, when linear line L4 has three or more intersections with the profile line of the pore 40, point D is one of the intersections that is the closest to point B along the profile line in a first direction and point E is one of the intersections that is the closest to point B along the profile line in a second direction. The first direction may be either of the clockwise direction and the counterclockwise direction. The second direction is opposite the first direction.

In the example shown in FIG. 13, point C is the intersection that is the closest to point A in the clockwise direction (in other words, in the upper side of line segment AB) and point D is the intersection that is the closest to point A in the counterclockwise direction (in other words, in the lower side of line segment AB). Point E is the intersection that is the closest to point B in the counterclockwise direction (in other words, in the upper side of line segment AB) and point F is the intersection that is the closest to point B in the clockwise direction (in other words, in the lower side of line segment AB).

The pore 40 should be determined to originate from the cracks 42 if the pore 40 is such that either one or both of the angle between line segment AC and line segment AD (angle CAD) and the angle between line segment EB and line segment FB (angle EBF) is (are) from 0° exclusive to 90° inclusive. Alternatively, the pore 40 may be estimated to originate from the cracks 42 if the pore 40 is such that either one or both of angle CAD and angle EBF is (are) less than or equal to a first threshold value angle. The first threshold value angle is an arbitrary angle of from 0° exclusive to 90° inclusive, from 0° exclusive to 60° inclusive, or from 0° exclusive to 30° inclusive.

Those pores 40 that originate from the cracks 42 tend to be elongated than those pores 40 that originate from the bubbles 44. Therefore, when the electron transport layer 26 has the same porosity and also the pores 40 in the electron transport layer 26 are formed in random directions, the pores 40 that originate from the cracks 42 are formed in such directions that the pores 40 can block electric current when compared with the pores 40 that originate from the bubbles 44, thereby further increasing the effective electrical resistance value.

The more elongated the pores 40, the greater the electrical resistance value of the electron transport layer 26. In other words, the smaller angle CAD and/or angle EBF, the greater the effect of the pores 40 increasing electrical resistance. Therefore, either one or both of angle CAD and angle EBF is (are) preferably less than or equal to 60° and more preferably less than or equal to 30°.

Note that although, in the foregoing, the points that give a maximum width on the profile line of the pore are designated A and B, and an angle regarding the points is measured, measurement is not necessarily performed at these points such as A and B so that the pore can be considered as having, for example, an elongated shape or a zigzag shape, and if the angle is from 0° exclusive to 90° inclusive in a similar measurement on the profile line of any given pore, the pore can be considered as having, for example, an elongated shape or a zigzag shape. The line segment that corresponds to line segment AB in such a case can be any line segment that extends in a direction in which there exits a pore.

In addition, although, in the foregoing, the length of the part with a maximum width is designated W on the assumption that the entire pore is observable (in a single cross-section), the angle may be measured by assuming that W/10 is equal to 10 nm when the entire pore is not observable (in a single cross-section).

Both angle CAD and angle EBF can be obtuse depending on the cutting direction even with the pores that originate from the cracks 42. Therefore, when the pores 40 observed in the cross-sectional SEM image include at least one pore 40 for which either one or both of angle CAD and angle EBF is (are) smaller than the first threshold value angle, some of the pores 40 in the electron transport layer 26 are safely estimated to originate from the cracks 42.

On the other hand, the pores 40 for which both angle CAD and angle EBF are from 90° exclusive to 180° inclusive are safely determined as originating from the bubbles 44. Alternatively, the pores 40 for which both angle CAD and angle EBF exceed a second threshold value angle may be estimated to originate from the bubbles 44. The second threshold value angle is an arbitrary angle of from 90° inclusive to 180° exclusive, from 120° inclusive to 180° exclusive, or from 150° inclusive to 180° exclusive.

Both angle CAD and angle EBF are obtuse for the pores 40 that originate from the bubbles 44 irrespective of the cutting direction. Therefore, when the pores 40 for which both angle CAD and angle EBF exceed the second threshold value angle account for 100% or greater than or equal to 10% of the pores 40 observed in the cross-sectional SEM image, some of the pores 40 in the electron transport layer 26 are estimated to originate from the bubbles 44.

In the present disclosure, for convenience of description, the shape of the pores 40 for which either one or both of angle CAD and angle EBF or the angle at an arbitrary point on the profile is (are) less than or equal to 90° is described as "the profile containing an acute or right angle." Likewise, the shape of the pores 40 for which both angle CAD and angle EBF exceed 90° is described as "containing an obtuse angle on the profile."

Referring to FIG. 9, another structural element such as the cathode 16 may be formed between the primary heating process (step S24) the secondary heating process (step S26). With a view to reducing the structural elements affected by the heating process and streamlining the heating process, the primary heating process and the secondary heating process are preferably performed successively. In addition, the rate of temperature increase in the secondary heating process is required to be faster than or equal to 1 degree Celsius/second. In addition, to prevent thermal degradation of the structural elements that are already formed (the layers formed before a step of forming the functional layer), the target temperature in the secondary heating process is required to be lower than or equal to the heat-resistant temperature of the structural elements that are already formed.

As described above, the third coating film 124 above the vicinity region 34 of the boundary line BL is thicker than the third coating film 124 above the center of the anode 10 by the meniscus effect. In other words, as shown in FIG. 4, the thickness, D2, of the electron transport layer 26 above the boundary line BL is greater than the thickness, D1, of the electron transport layer 26 above the center of the anode 10 (D1<D2). Achieving this difference in thickness requires that the third component solution 126 should have a high wettability to the light-emitting layer 24 in step S22. In other words, it is required that the third component solution 126 has a contact angle of less than 90° to the light-emitting layer 24.

As general tendency, it would be reasonably expected that the light-emitting element in the light-emitting element layer 6 can emit light that is more uniform when each layer in the light-emitting element layer 6 has a thickness that is more uniform. Therefore, in related art, each component solution is applied so that the coating film has a uniform thickness. Specifically, when the solution is applied by spin-coating in related art, the rotational speed is set to approximately 3,000 rpm, and the volume concentration of the solute is set to approximately 6 mg/ml. In addition, the rate of temperature increase in the heating process is typically below 0.5 degrees Celsius/second so as not to give thermal shock to the coating film and the layers that are already formed.

In contrast, the inventors of the present disclosure have increased the wettability of the third component solution 126 to the underlayer layer and rendered the thickness of the hole transport layer 22 non-uniform such that D1<D2 by the meniscus effect (see FIG. 4). In addition, as described above, the inventors have rapidly elevated the temperature of the third coating film 124.

To increase the wettability, when the third component solution 126 is applied by spin-coating in step S22 in step S14 in accordance with the present disclosure, at least the rotational speed is set to less than or equal to 2,000 rpm and more preferably to less than or equal to 1,000 rpm. Additionally or alternatively, the volume density of the solute in the third component solution 126 is preferably greater than or equal to 6 mg/ml and more preferably greater than or equal to 8 mg/ml.

In addition, the wettability of the solution to the underlayer layer tends to be higher when the surface free energy of the underlayer layer is higher. Therefore, the surface free energy of the light-emitting layer 24 is preferably high and specifically, preferably greater than or equal to 86 mNm/m. 86 mNm/m is the surface free energy of clean silica glass. "mNm/m" is milliNewton meters per meter.

Referring back to FIG. 8, next, the cathode 16 is formed (step S16). The cathode 16 may be formed by, for example, forming a thin metal material film commonly to the subpixels by, for example, vacuum vapor deposition or sputtering. This completes the formation of the light-emitting element layer 6.

Next, the sealing layer 8 is formed (step S18). When the sealing layer 8 contains an organic sealing film, this organic sealing film may be formed by applying an organic sealing material. In addition, when the sealing layer 8 contains an inorganic sealing film, this inorganic sealing film may be formed by, for example, CVD. The sealing layer 8 is hence formed, sealing the light-emitting element layer 6.

Then, the glass substrate may be lifted, functional films may be attached, and other steps may be performed as needed, to complete the manufacture of the display device 2. The functional films include, for example, a polarizer film, a sensor film with a touch sensor panel function, a protective film, and an antireflective film.

Functions and Effects

The structure and method in accordance with the present embodiment achieve advantageous effects of, for example, reducing the leakage current, increasing the luminous efficiency, reducing abnormal light emission, reducing crosstalk, separating components, and reducing the manufacturing cost.

Embodiment 2

The following will describe another embodiment of the disclosure. Note that for convenience of description, members of the present embodiment that have the same function as members of the previous embodiment are indicated by the same reference numerals, and description thereof not repeated.

Figure 14:
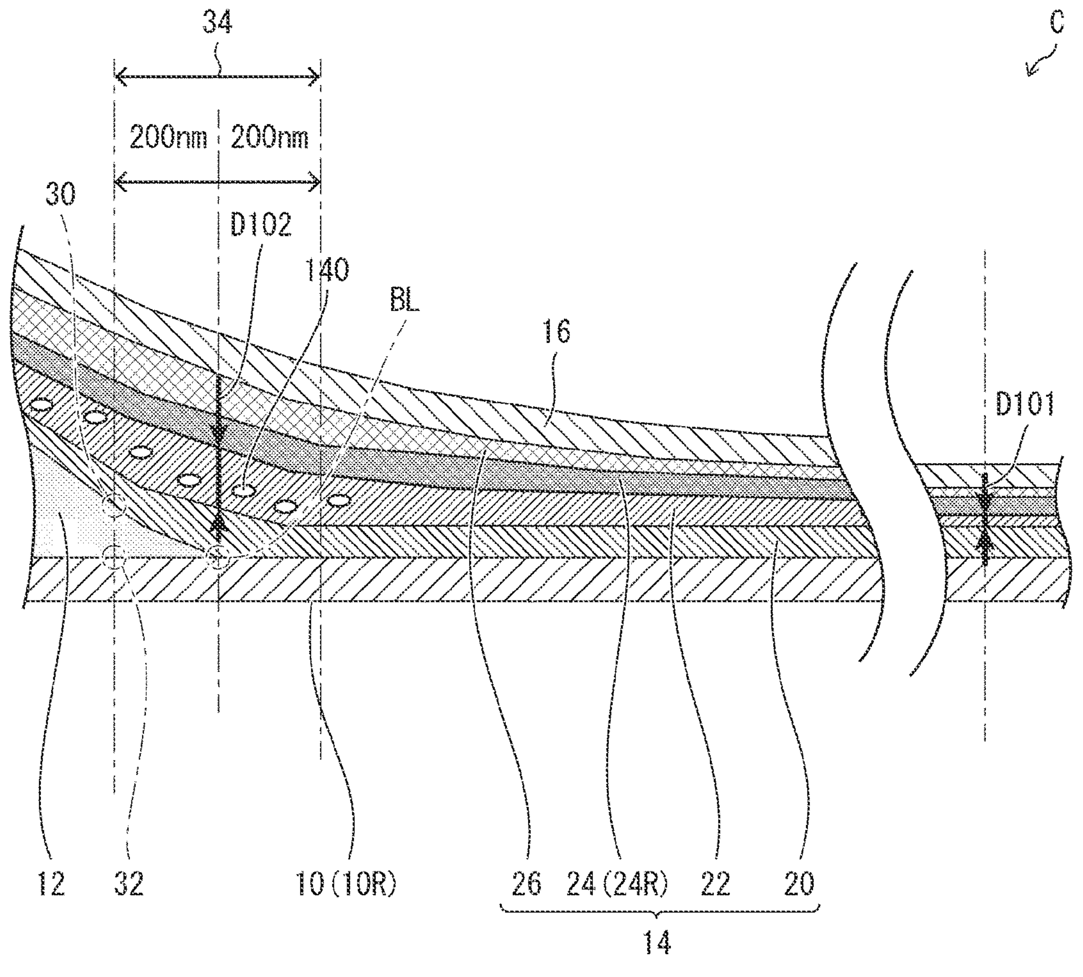
FIG. 14 is a schematic enlarged cross-sectional view of a structure of an active layer in accordance with another embodiment of the present disclosure.

FIG. 14 is a schematic enlarged cross-sectional view of a structure of the active layer 14 in accordance with an embodiment of the present disclosure. Note that FIG. 14 shows only the anode 10R, the bank 12, the active layer 14, and the cathode 16, with the other structural elements omitted, to focus the description on the electron transport layer 26 in the active layer 14.

Referring to FIG. 14, the active layer 14 in accordance with the present embodiment differs from the active layer 14 in accordance with aforementioned Embodiment 1 in that in the former, the hole transport layer 22, instead of the electron transport layer 26, has the pores 40. In the active layer 14 in accordance with the present embodiment, the thickness, D102, of the hole transport layer 22 above the boundary line BL is larger than the thickness, D101, of the hole transport layer 22 above the central portion of the anode 10.

In forming the hole transport layer 22 in accordance with the present embodiment, the second coating film is formed so that the thickness of the second coating film in the vicinity region 34 of the boundary line BL can be larger than the thickness of the second coating film above the center of the anode 10, similarly to the formation of the electron transport layer 26 in aforementioned Embodiment 1. Next, the hole transport layer 22 with the pores 40 is obtained by subjecting the second coating film to the primary heating process and the secondary heating process in this order.

Meanwhile, the electron transport layer 26 with no pores 40 is obtained by slowing down the rate of temperature increase in the process of heating the third coating film 124 in the formation of the electron transport layer 26 in accordance with the present embodiment.

Functions and Effects

The hole transport layer 22 in accordance with the present embodiment has a large effective electrical resistance value in the direction parallel to the electric lines of force above the vicinity region 34 of the boundary line BL, similarly to the electron transport layer 26 in accordance with aforementioned Embodiment 1. Therefore, the structure and method in accordance with the present embodiment achieve advantageous effects of, for example, reducing the leakage current, increasing the luminous efficiency, reducing abnormal light emission, reducing crosstalk, separating components, and reducing the manufacturing cost, similarly to the structure and method in accordance with aforementioned Embodiment 1.

Furthermore, the structure and method in accordance with the present embodiment, when the secondary heating process is performed before the light-emitting layer 24 is formed, have an advantage of allowing a setting of a temperature higher than the heat-resistant temperature of the light-emitting layer 24. The heat-resistant temperature of the light-emitting material tends to be lower than the heat-resistant temperature of the charge transport material. Therefore, the heat-resistant temperature of the light-emitting layer 24 tends to be lower than the heat-resistant temperatures of the hole injection layer 20, the hole transport layer 22, and the electron transport layer 26.

The structure and method in accordance with the present embodiment may be combined with the structure and method in accordance with aforementioned Embodiment 1. In other words, both the hole transport layer 22 and the electron transport layer 26 may have the pores 40.

Embodiment 3

The following will describe another embodiment of the disclosure. Note that for convenience of description, members of the present embodiment that have the same function as members of the previous embodiments are indicated by the same reference numerals, and description thereof not repeated.

Figure 15:
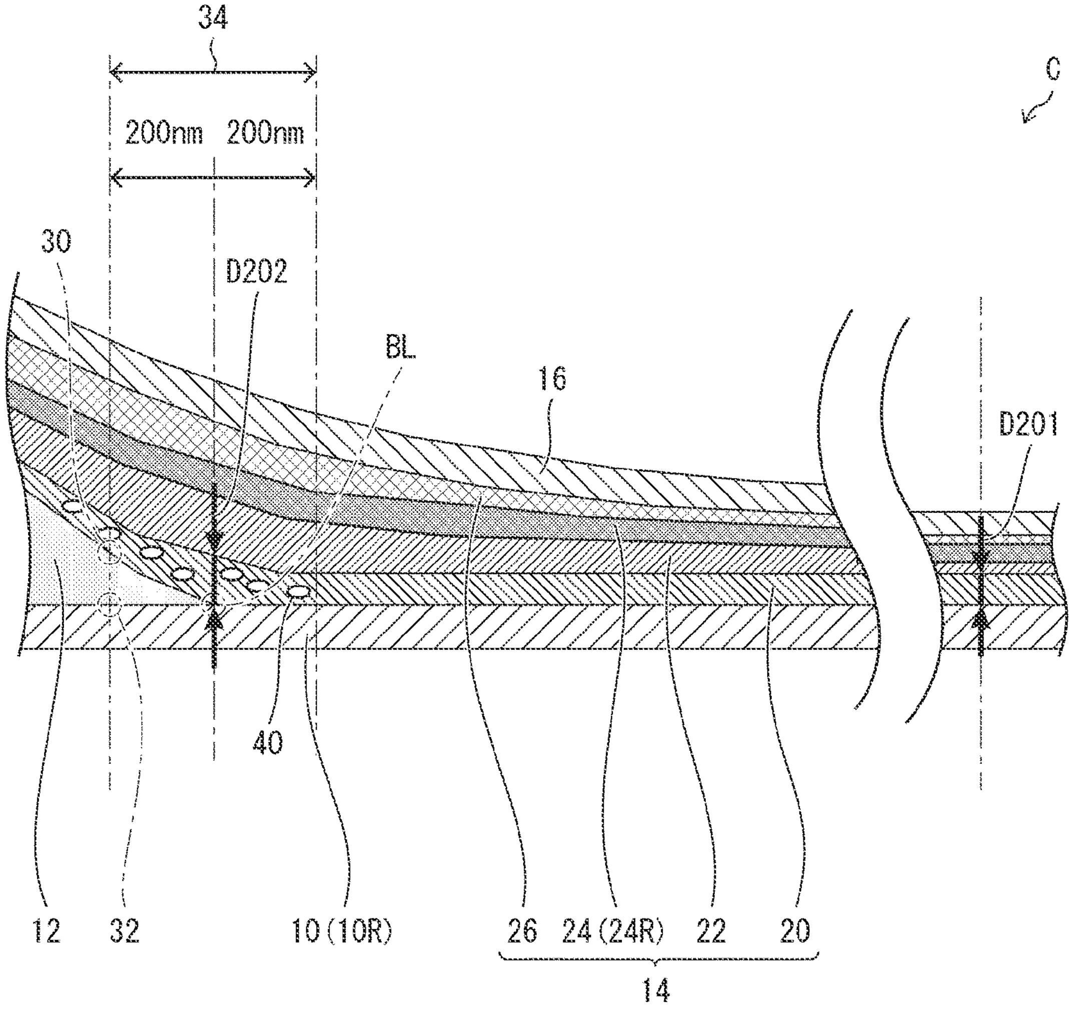
FIG. 15 is a schematic enlarged cross-sectional view of a structure of an active layer in accordance with another embodiment of the present disclosure.

FIG. 15 is a schematic enlarged cross-sectional view of a structure of the active layer 14 in accordance with an embodiment of the present disclosure. Note that FIG. 15 shows only the anode 10R, the bank 12, the active layer 14, and the cathode 16, with the other structural elements omitted, to focus the description on the electron transport layer 26 in the active layer 14.

Referring to FIG. 15, the active layer 14 in accordance with the present embodiment differs from the active layer 14 in accordance with aforementioned Embodiment 1 in that in the former, the hole injection layer 20, instead of the electron transport layer 26, has the pores 40. In the active layer 14 in accordance with the present embodiment, the thickness, D202, of the hole injection layer 20 above the boundary line BL is larger than the thickness, D201, of the hole injection layer 20 above the central portion of the anode 10.

In forming the hole injection layer 20 in accordance with the present embodiment, the first coating film is formed so that the thickness of the first coating film in the vicinity region 34 of the boundary line BL can be larger than the thickness of the second coating film above the center of the anode 10, similarly to the formation of the electron transport layer 26 in aforementioned Embodiment 1. Next, the hole injection layer 20 is obtained by subjecting the second coating film to the primary heating process and the secondary heating process in this order.

Meanwhile, the electron transport layer 26 with no pores 40 is obtained by slowing down the rate of temperature increase in the process of heating the third coating film 124 in the formation of the electron transport layer 26 in accordance with the present embodiment.

Function and Effects

The hole injection layer 20 in accordance with the present embodiment has a large effective electrical resistance value in the direction parallel to the electric lines of force above the vicinity region 34 of the boundary line BL, similarly to the electron transport layer 26 in accordance with aforementioned Embodiment 1. Therefore, the structure and method in accordance with the present embodiment achieve advantageous effects of, for example, reducing the leakage current, increasing the luminous efficiency, reducing abnormal light emission, reducing crosstalk, separating components, and reducing the manufacturing cost, similarly to the structure and method in accordance with aforementioned Embodiment 1.

Furthermore, the structure and method in accordance with the present embodiment, when the secondary heating process is performed before the light-emitting layer 24 is formed, have an advantages of allowing a setting of a temperature higher than the heat-resistant temperature of the light-emitting layer 24. The heat-resistant temperature of light-emitting material tends to be lower than the heat-resistant temperature of the charge transport material. Therefore, the heat-resistant temperature of the light-emitting layer 24 tends to be lower than the heat-resistant temperatures of the hole injection layer 20, the hole transport layer 22, and the electron transport layer 26.

The structure and method in accordance with the present embodiment may be combined with the structure and method in accordance with aforementioned Embodiment 1 and/or the structure and method in accordance with aforementioned Embodiment 2. In other words, the three layers of the hole injection layer 20, the hole transport layer 22, and the electron transport layer 26 may have the pores 40, the two layers of the hole injection layer 20 and the hole transport layer 22 may have the pores 40, and the two layers of the hole injection layer 20 and the electron transport layer 26 may have the pores 40.

Example 1

The following will describe an example of Embodiment 1 of the present disclosure.

Manufacturing Step

First, TFTs were formed on the substrate 4 (step S2), and a stack of IZO and Ag films was formed as the anode 10 by sputtering (step S4). Next, the bank 12 was formed from a polyimide (step S6). The opening 12A in the bank 12 had an elongated circular shape in which a rectangle had a semicircle added onto each of its shorter sides.

Next, 0.1 mL of a nickel acetate solution (first component solution) was obtained by dissolving 249 mg of nickel acetate in 5 mL of ethanol, a nickel acetate solution film (first coating film) was obtained by applying the nickel acetate solution onto the stack of IZO and Ag films by spin-coating, and the hole injection layer 20 was obtained by heating the nickel acetate solution film in the atmosphere at 230 degrees Celsius for 1 hour (step S8). A nickel oxide film was formed in this manner as the hole injection layer 20.

Next, a methanol solution of p-nitrobenzoic acid was applied onto the nickel oxide film. Then, after at least 5 seconds had elapsed, the solution of p-nitrobenzoic acid was dried. A self-assembled monolayer (SAM) was formed in this manner on the surface of the nickel oxide film.

Next, a TFB solution (second component solution) was obtained by dissolving 8 mg of TFB in 1 mL of chlorobenzene, a TFB solution film (second coating film) was obtained by applying the TFB solution onto the SAM by spin-coating, and the hole transport layer 22 was obtained by heating the TFB solution film in the atmosphere at 230 degrees Celsius for 1 hour (step S10). A TFB film was formed in this manner as the hole transport layer 22.

Next, 1 mL of a solution containing quantum dots with a CdSe/ZnS core-shell structure was applied onto the p-TPD film by spin-coating and dried (step S12). A quantum-dot layer was formed in this manner as the light-emitting layer 24.

Next, a ZnO solution (third component solution 126) was obtained containing ZnO nanoparticles with a particle diameter of 12 nm (step S20), and a ZnO solution film (third coating film 124) was obtained by applying the ZnO solution onto the light-emitting layer 24 by spin-coating. The rotational speed was 2,000 rpm.

Next, the ZnO solution film was heated in the atmosphere or in an inert atmosphere (steps S24 and S26). This heating process involved successive primary and secondary heating processes. In the heating process, the target temperature was approximately 130 degrees Celsius, the rate of temperature increase until the target temperature was reached was 1 degree Celsius/second, and the thermal insulation time after the target temperature was reached was approximately 0.2 hours. A ZnO nanoparticle film was formed in this manner as the electron transport layer 26 (step S14).

Next, a Ag electrode was vapor-deposited onto the electron transport layer 26 by vacuum vapor deposition (step S16). A Ag electrode was obtained in this manner as the cathode 16.

A light-emitting element layer 6 in accordance with Example 1 was formed by this process.

Comparative Example 1

In Comparative Example 1, the rate of temperature increase in the heating process for the ZnO solution film was approximately 0.2 degrees Celsius/second. In addition, a photosensitive resist was applied onto the light-emitting layer 24, and the photosensitive resist was solidified in accordance with a pattern by photolithography and developed in a development solution, to obtain a resist layer. Then, a ZnO solution film was obtained by applying a ZnO solution onto the resist layer and the light-emitting layer 24, and the resist layer was removed using a remover after the ZnO solution film was subjected to the heating process, to obtain the electron transport layer 26. The photosensitive resist was an acrylic resin-based resist, the development solution was TMAH, and the remover was an organic alkali-based detaching solution.

A light-emitting element layer 6 in accordance with Comparative Example 1 was formed by otherwise the same process as in Example 1.

Comparative Example 2

In Comparative Example 2, after the resist layer was removed using a remover, furthermore, the resist layer was completely removed in a rinse liquid. The rinse liquid was pure water and IPA.

A light-emitting element layer 6 in accordance with Comparative Example 2 was formed by otherwise the same process as in Comparative Example 1.

Comparative Example 3

In Comparative Example 3, the red light-emitting layer 24R, the green light-emitting layer 24G, and the blue light-emitting layer 24B were formed in accordance with respective patterns by photolithography.

A light-emitting element layer 6 in accordance with Comparative Example 3 was formed by otherwise the same process as in Example 1.

Measurement of Voltage and Current

Figure 16:
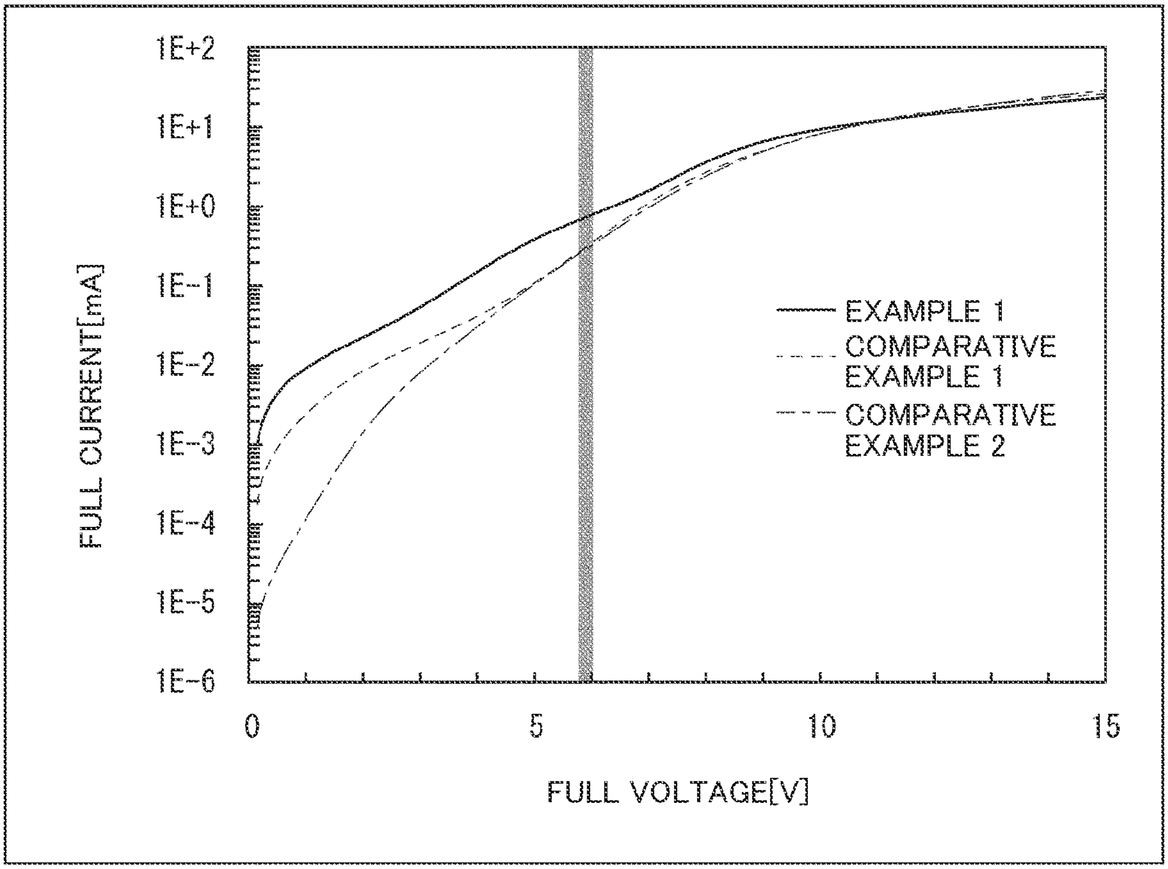
FIG. 16 is a diagram showing a semi-logarithmic graph representing the current-voltage characteristics of a light-emitting element layer in accordance with an example of the present disclosure and light-emitting element layers in accordance with comparative examples.

FIG. 16 is a diagram showing a semi-logarithmic graph representing the current-voltage characteristics of the light-emitting element layer 6 in accordance with Example 1 and the light-emitting element layers 6 in accordance with Comparative Examples 1 and 2. In FIG. 16, the horizontal axis indicates voltage, the vertical axis indicates electric current, and the gray strip indicates the voltage at a maximum EQE.

Figure 17:
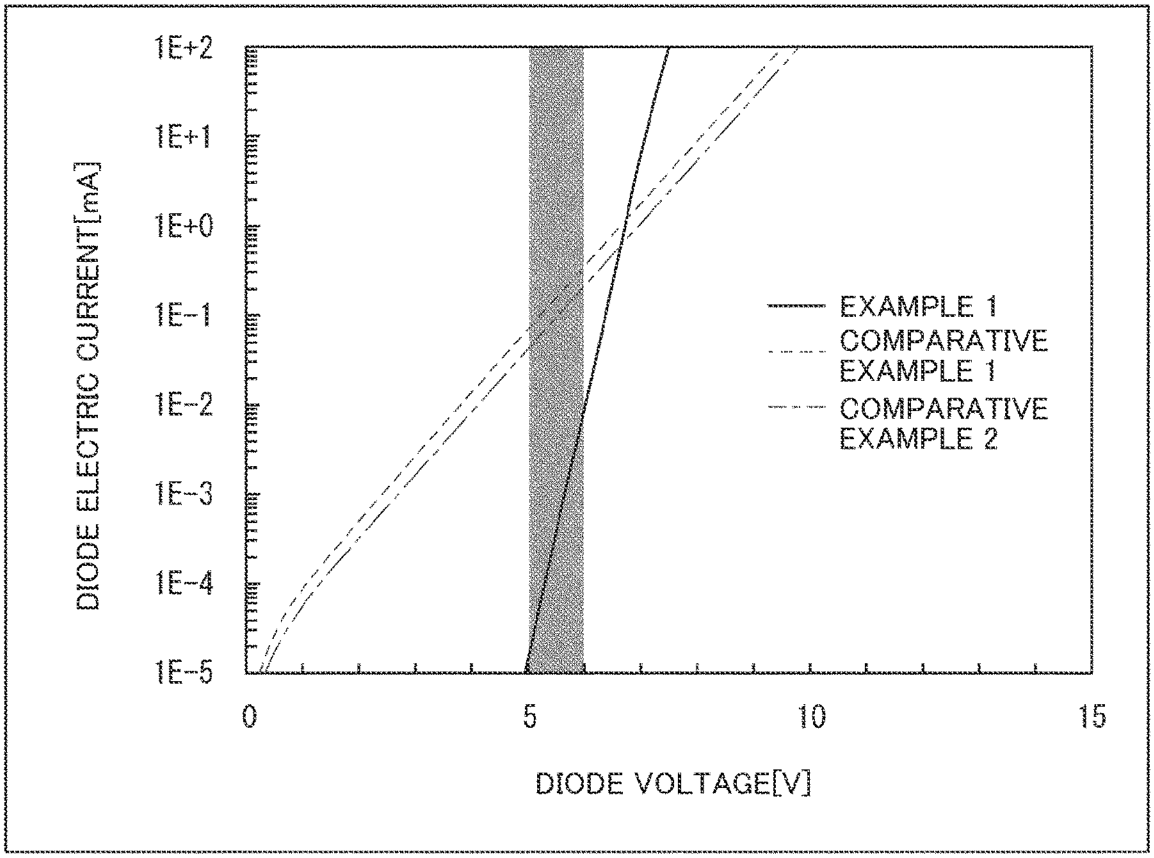
FIG. 17 is a diagram showing a semi-logarithmic graph representing the current-voltage characteristics corresponding to a light-emitting element in accordance with an example of the present disclosure and light-emitting elements in accordance with comparative examples.

FIG. 17 is a diagram showing a semi-logarithmic graph representing the current-voltage characteristics corresponding to the light-emitting element in accordance with Example 1 and the light-emitting elements in accordance with Comparative Examples 1 and 2. In FIG. 17, the horizontal axis indicates voltage, the vertical axis indicates electric current, and the gray strip indicates the voltage at a maximum EQE.

In FIGS. 16 and 17, the horizontal axis indicates voltage, the vertical axis indicates electric current, and the gray strip indicates the voltage at which the luminance of the light-emitting element rose.

In each of the light-emitting element layers 6 of Example 1 and Comparative Examples 1 and 2, voltage was applied across the anode 10 and the cathode 16, and the electric current that flows between the anode 10 and the cathode 16 was measured against the voltage.

The electric current that flows between the anode 10 and the cathode 16 includes the effective electric current that contributes to the emission of light by the light-emitting element and the invalid current that does not contribute to the emission of light by the light-emitting element. Therefore, the current-voltage characteristics across the entire light-emitting element layer were analyzed in detail, and the current-voltage characteristics corresponding to the light-emitting element were extracted. Throughout the following description, the voltage that was applied across the anode 10 and the cathode 16 will be referred to as the "full voltage," the electric current that flowed between the anode 10 and the cathode 16 will be referred to as the "full electric current," and the current-voltage characteristics across the entire light-emitting element layer will be referred to as the "full V-I characteristics." In addition, the effective voltage that contributed to the emission of light by the light-emitting element will be referred to as the "diode voltage," the effective electric current that contributed to the emission of light by the light-emitting element will be referred to as the "diode electric current," and the current-voltage characteristics corresponding to the light-emitting element will be referred to as the "diode V-I characteristics."

The detailed analysis was performed by electric current analysis in which a diode equation and a spatial-charge-restricting current formula were combined as parallel circuitry.

As shown in FIG. 16, the full V-I characteristics of Example 1 and Comparative Examples 1 and 2 appeared mutually different at low voltages lower than the voltage that indicated the maximum EQE and, in contrast, appeared mutually similar at high voltages higher than the voltage that indicated the maximum EQE.

In all the light-emitting elements of Example 1 and Comparative Examples 1 and 2, the luminance rose when the full voltage was near 4 volts, and the external quantum efficiency (EQE) was a maximum when the full voltage was between 5 volts and 6 volts. The maximum EQE was 2.1% in Example 1, 1.8% in Comparative Example 1, and 0.7% in Comparative Example 2.

As shown in FIG. 17, the diode V-I characteristics of Example 1 and Comparative Examples 1 and 2 were mutually different across the measured voltage range. The inclination of the diode V-I characteristics in the semi-logarithmic graph corresponded to the diode factor. The steeper the inclination was, the smaller the diode factor, and the better the diode V-I characteristics. The diode factor was approximately 5.9 in Example 1 and approximately 24 in Comparative Examples 1 and 2.

The light-emitting element was a diode that emitted light by the recombination of electrons and holes. Therefore, the effective electric current that flowed through the light-emitting element was dominantly the recombination current, and the diode factor of the light-emitting element had a minimum value of 2. A large diode factor of a light-emitting diode in which a recombination current was dominant would have generally reflected, for example, localization of light-emitting recombination and non-uniform carrier injection.

Since the diode factors in Comparative Examples 1 and 2 were larger than the diode factor in Example 1, the luminescence properties of the light-emitting element would have deteriorated due to the patterning of the electron transport layer. In addition, it would be understood that since the diode factors in Comparative Examples 1 and 2 were both large, the luminescence properties was not improved even when the resist layer was completely removed. It would be concluded from these two respects that it is the patterning step, not the residue of the photosensitive resist, that deteriorated the luminescence properties. The patterning step involved a step of forming a resist layer on the light-emitting layer 24, a step of developing the resist layer, and a step of removing the resist layer. Therefore, at least one of the photosensitive resist, the development solution, and the remover adversely affected the light-emitting layer 24.

Then, since no patterning step was performed in Example 1, the light-emitting layer 24 was not degraded, and the light-emitting element had good diode V-I characteristics.

Observation of Cross-Sectional SEM

Figure 18:
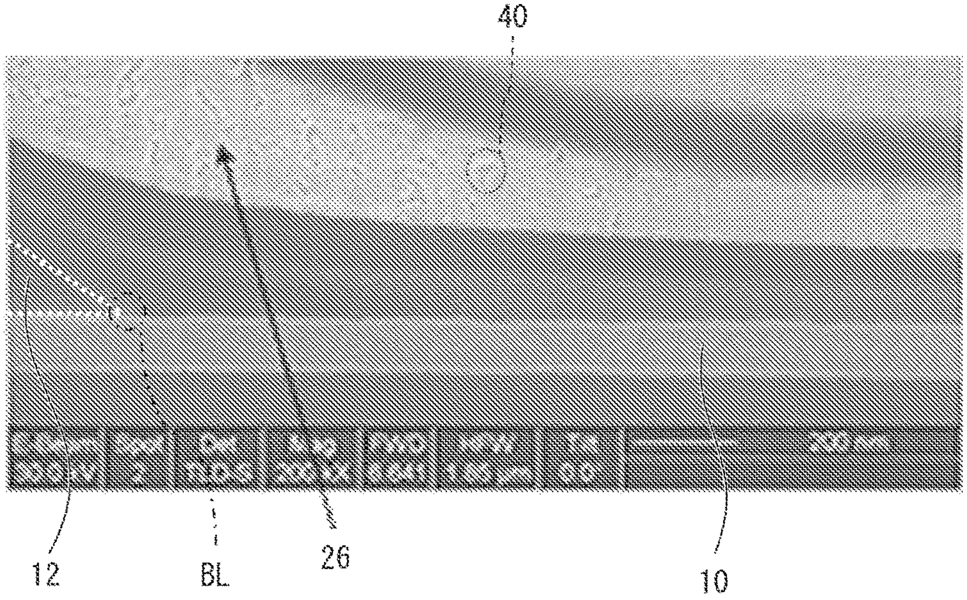
FIG. 18 is an illustration representing a part of a cross-sectional SEM image of a light-emitting element layer in accordance with an example of the present disclosure, the part containing a boundary line between a bank and an anode.

FIG. 18 is an illustration representing a part of a cross-sectional SEM image of the light-emitting element layer 6 in accordance with Example 1, the part containing the boundary line BL.

Figure 19:
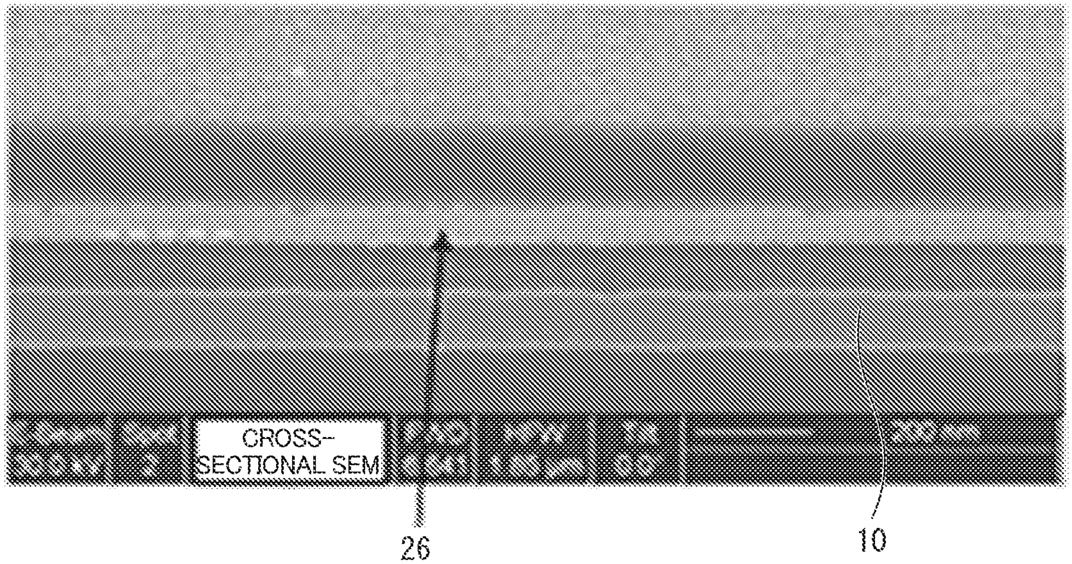
FIG. 19 is an illustration representing a part of the cross-sectional SEM image of the light-emitting element layer in accordance with the example of the present disclosure, the part containing the central portion of the anode.

FIG. 19 is an illustration representing a part of the cross-sectional SEM image of the light-emitting element layer 6 in accordance with Example 1, the part containing the central portion of the anode 10.

After the measurement of voltage and current, the light-emitting element layers 6 in accordance with Example 1 and Comparative Examples 1 and 2 were cut along the plane that passed through the lengthwise center of the opening 12A in the bank, that extended in the direction parallel to the width of the opening 12A, and that was perpendicular to the top face of the anode 10. Then, the cutting plane was observed under a scanning electron microscope (SEM).

Referring to FIG. 18, the electron transport layer 26 in accordance with Example 1 had a plurality of pores 40 above the vicinity region 34 of the boundary line BL and no pores 40 internal to the vicinity region 34. In addition, the basic structure of the light-emitting element layer 6 in accordance with Example 1 was equivalent to the basic structure shown in FIG. 3, except that the light-emitting layer 24 was a monolayer and that the light-emitting layer 24 was formed commonly to a plurality of light-emitting elements.

The electron transport layers in accordance with Comparative Example 1 to 3 had no pores. In addition, the basic structures of the light-emitting element layers 6 in accordance with Comparative Examples 1 and 2 were equivalent to the basic structure of the light-emitting element layer 6 in accordance with Example 1, except that the electron transport layer 26 was separated for each light-emitting element. In addition, the basic structure of the light-emitting element layer 6 in accordance with Comparative Example 3 was equivalent to the basic structure of the light-emitting element layer in accordance with Example 1, except that the light-emitting layer 24 included the red light-emitting layer 24R, the green light-emitting layer 24G, and the blue light-emitting layer 24B and that the light-emitting layer 24 was separated for each light-emitting element.

Therefore, the rate of temperature increase in the secondary heating process would have needed to be greater than or equal to 1 degree Celsius/second so that the electron transport layer 26 could have the pores 40 above the vicinity region 34 of the boundary line BL.

Separation of Elements

In the light-emitting element layer 6 in accordance with Comparative Example 3, abnormal, intense annular light emission was observed in a plurality of light-emitting elements. This abnormal light emission would have come from the peripheral portions of the light-emitting regions. Electric current would have been so concentrated in these portions that carriers were injected to the light-emitting layer in large numbers, which in turn caused the portions to emit light with high luminance.

In addition, unintended linear emission of light was observed between, the light-emitting regions of the light-emitting elements. This unintended inter-element emission of light could have been caused by the residues of the light-emitting material that emitted light upon conduction of electric current. This would have been caused by incomplete removal of the light-emitting material in the step of patterning the light-emitting layer and incomplete electrical separation of the light-emitting elements.

Both abnormal light emission and inter-element light emission were observed in a plurality of locations.

Meanwhile, in the light-emitting element layer 6 in accordance with Example 1, neither abnormal light emission nor inter-element light emission was observed. Therefore, the light-emitting elements would have been electrically separated by the electron transport layer 26 including the pores 40 above the vicinity region 34 of the boundary line BL in the structure in accordance with Example 1.

Measurement of Porosity

Figure 20:
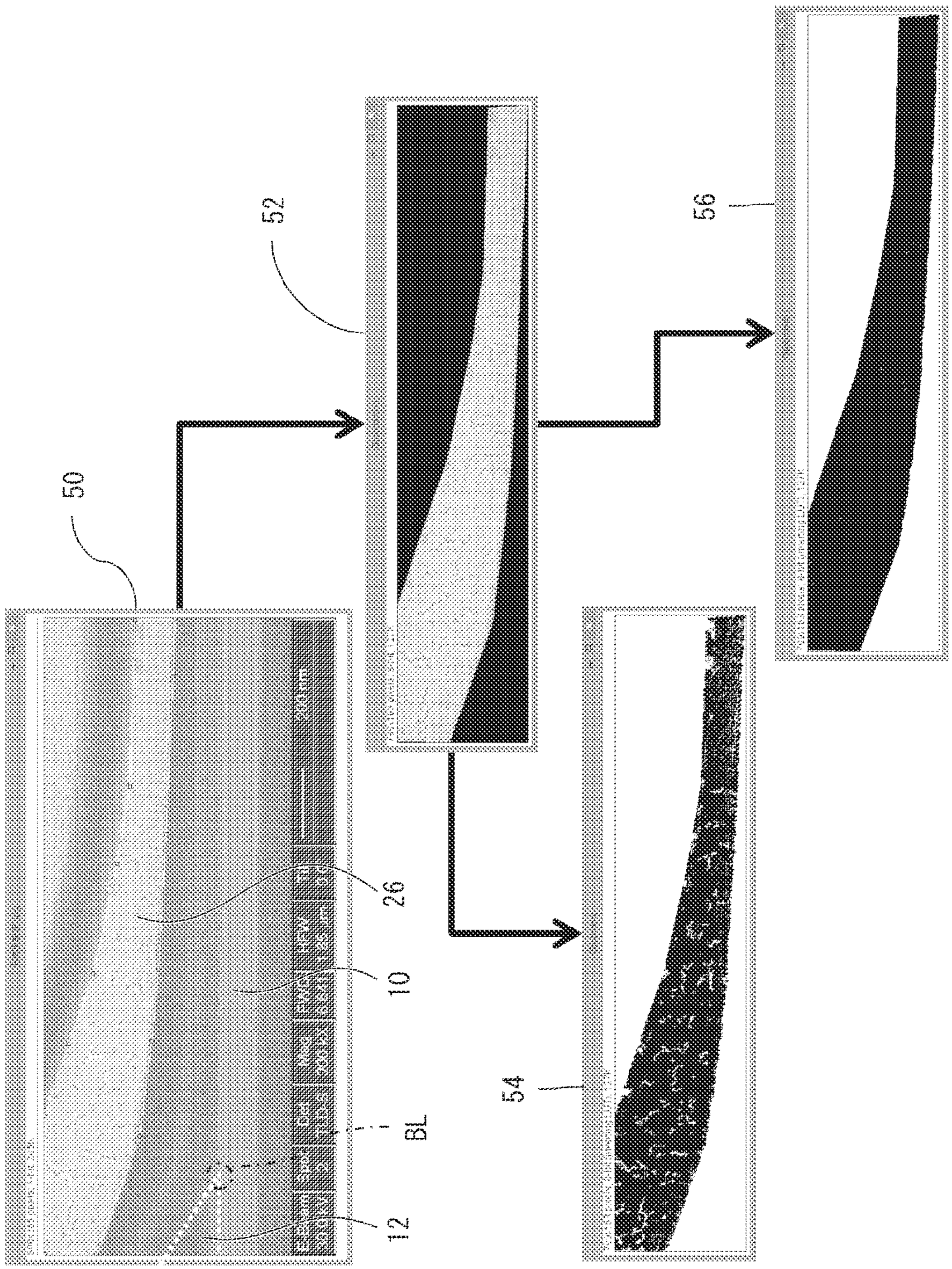
FIG. 20 is a diagram illustrating an exemplary porosity measurement method.

FIG. 20 is a diagram illustrating an exemplary porosity measurement method.

First, a portion containing the electron transport layer 26 above the vicinity region 34 of the boundary line BL was extracted from the cross-sectional SEM image of Example 1 and enlarged as the original image 50. The portion of the electron transport layer 26 contained in the original image 50 was only the portion containing the pores 40.

Next, the electron transport layer 26 was extracted from the original image 50 on the basis of human visual judgement, and the regions outside the electron transport layer 26 were rendered black as a background and trimmed in a suitable manner. A primary processed image 52 was hence obtained.

Next, the pores 40 were extracted from the primary processed image 52 by contrast evaluation, and a black and white (binary) image was made of the cross-section of the electron transport layer 26. Specifically, the cross-sections of the pores 40 were rendered white, and the cross-section of the electron transport layer 26 except the pores 40 was rendered black. In addition, the background was rendered white. A secondary processed image 54 was hence obtained. In addition, the regions of the primary processed image 52 inside the electron transport layer 26 were rendered black, and the background was rendered white, to obtain a tertiary processed image 56.

Next, the black pixels in the secondary processed image 54 and the tertiary processed image 56 were counted. There were 54,374 black pixels in the secondary processed image 54 and 60,335 black pixels in the tertiary processed image 56.

$$\text{Porosity} = 1 - 54374/60335 \approx 0.0988$$

Therefore, the porosity of the electron transport layer 26 in accordance with Example 1 was approximately 9.88% above the vicinity region 34 of the boundary line BL. Therefore, the separation of elements by the pores 40 would be realized when the porosity was greater than or equal to 9%. In addition, it would have been difficult to achieve a porosity in excess of 60% because a volume expansion that exceeded elasticity limitation must have been assumed. Therefore, the porosity of the electron transport layer 26 would have been from 9% to 60%, both inclusive, above the vicinity region 34 of the boundary line BL.

The disclosure is not limited to the description of the embodiments above and may be altered within the scope of the claims. Embodiments based on a proper combination of technical means disclosed in different embodiments are encompassed in the technical scope of the disclosure. Furthermore, new technological features can be created by combining different technical means disclosed in the embodiments.

The invention claimed is:

1. A light-emitting element comprising:

a first electrode and a second electrode opposite each other;

a bank at least partially adjacent to the first electrode or at least partially on the first electrode;

a light-emitting layer between the first electrode and the second electrode; and a functional layer either between the first electrode and the light-emitting layer or between the second electrode and the light-emitting layer, wherein:

a vicinity region includes a boundary line between a top face of the first electrode and a side face of the bank, the functional layer has a pore above the vicinity region, the functional layer is formed commonly to a plurality of light-emitting elements, including the light-emitting element, and is a first charge transport layer, the light-emitting element further comprises a second charge transport layer having an opposite polarity compared to the first charge transport layer, the light-emitting layer is sandwiched between the first charge transport layer and the second charge transport layer, the second charge transport layer is at least partially in direct contact with the first charge transport layer above the bank, and the pore does not exist inside the vicinity region in a plan view of the functional layer.

2. The light-emitting element according to claim 1, wherein the vicinity region further includes a region parallel to the top face of the first electrode, the region spreading up to 200 nm from the boundary line on both sides of the boundary line.

3. The light-emitting element according to claim 1, wherein the vicinity region has a porosity of from 9% to 60%, both inclusive.

4. The light-emitting element according to claim 1, wherein D1<D2, where;

D1 is a first thickness of the functional layer above a center of the first electrode, the first thickness being taken perpendicular to the top face of the first electrode, and D2 is a second thickness of the functional layer above the boundary line, the second thickness being taken perpendicular to the top face of the first electrode.

5. The light-emitting element according to claim 1, wherein the functional layer contains a metal oxide.

6. The light-emitting element according to claim 5, wherein the metal oxide contains a metal element selected from the group consisting of Zn, Cr, Ni, Ti, Nb, Al, Mg, Li, W, In, Ga, Ta, Hf, Zr, Y, La, Sr, and Mo.

7. The light-emitting element according to claim 5, wherein the metal oxide contains at least one metal element.

8. The light-emitting element according to claim 1, wherein the functional layer contains an organic compound.

9. The light-emitting element according to claim 8, wherein the organic compound contains an organic hole transport material selected from the group consisting of PVK, TFB, p-TPD, PPV, and $Alq_3$.

10. The light-emitting element according to claim 1, wherein the first charge transport layer is a charge injection layer.

11. The light-emitting element according to claim 1, wherein the first charge transport layer is a charge transport layer.

12. A display device comprising the plurality of light-emitting elements, including the light-emitting element according to claim 1.

13. A light-emitting element comprising:

a first electrode and a second electrode opposite each other;

a bank at least partially adjacent to the first electrode or at least partially on the first electrode;

a light-emitting layer between the first electrode and the second electrode; and a functional layer either between the first electrode and the light-emitting layer or between the second electrode and the light-emitting layer, wherein:

a vicinity region includes a boundary line between a top face of the first electrode and a side face of the bank, the functional layer has a pore above the vicinity region, the light-emitting element further comprises:

a first charge transport layer; and a second charge transport layer having an opposite polarity compared to the first charge transport layer, the light-emitting layer is sandwiched between the first charge transport layer and the second charge transport layer, the second charge transport layer is at least partially in direct contact with the first charge transport layer above the bank, and the pore does not exist inside the vicinity region in a plan view of the functional layer.

14. The light-emitting element according to claim 13, wherein the vicinity region has a porosity from 9% to 60%, both inclusive.

15. The light-emitting element according to claim 13, wherein D1<D2, where:

D1 is a first thickness of the functional layer above a center of the first electrode, the first thickness being taken perpendicular to the top face of the first electrode, and D2 is a second thickness of the functional layer above the boundary line, the second thickness being taken perpendicular to the top face of the first electrode.

* * * * *